(12) United States Patent
Kim et al.

(10) Patent No.: US 12,713,587 B2
(45) Date of Patent: Aug. 18, 2026

(54) SEMICONDUCTOR DEVICE

(71) Applicant: Samsung Electronics Co., Ltd., Suwon-si (KR)

(72) Inventors: Jooncheol Kim, Suwon-si (KR); Kanguk Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 306 days.

(21) Appl. No.: 18/244,456

(22) Filed: Sep. 11, 2023

(65) Prior Publication Data

US 2024/0147702 A1 May 2, 2024

(30) Foreign Application Priority Data

Oct. 28, 2022 (KR) ........................ 10-2022-0141052

(51) Int. Cl.
*H10B 12/00* (2023.01)

(52) U.S. Cl.
CPC ........... *H10B 12/482* (2023.02); *H10B 12/34* (2023.02); *H10B 12/50* (2023.02)

(58) Field of Classification Search
CPC .. H10B 12/00; H10B 12/0383; H10B 12/053; H10B 12/315; H10B 12/34; H10B 12/36; H10B 12/48; H10B 12/482; H10B 12/488; H10B 12/50; H10D 89/10
See application file for complete search history.

(56) References Cited

U.S. PATENT DOCUMENTS

| | | | | |
|---|---|---|---|---|
| 7,713,828 B2 | | 5/2010 | Yuki | |
| 9,018,708 B2 | | 4/2015 | Eun | |
| 9,418,891 B2 | | 8/2016 | Rouh et al. | |
| 2012/0032246 | A1* | 2/2012 | Honda ................ | H10D 30/681 257/E21.422 |
| 2013/0052780 | A1* | 2/2013 | Kim .................... | H10B 12/485 257/E21.409 |
| 2015/0294923 | A1* | 10/2015 | Shin .................... | H10B 12/033 257/532 |
| 2019/0355728 | A1* | 11/2019 | Kim .................... | H10B 12/033 |
| 2020/0286734 | A1* | 9/2020 | Yoon ................ | H01L 21/32155 |
| 2022/0115377 | A1 | 4/2022 | Kim et al. | |
| 2022/0122986 | A1 | 4/2022 | Jang et al. | |

FOREIGN PATENT DOCUMENTS

TW 202230739 A 8/2022

OTHER PUBLICATIONS

Office Action and Search Report from the Taiwan Patent Office dated May 13, 2024, for Taiwan Patent Application No. 112131815.

* cited by examiner

*Primary Examiner* — Brook Kebede
(74) *Attorney, Agent, or Firm* — Muir Patent Law, PLLC

(57) ABSTRACT

A semiconductor device includes a substrate including a cell region and a core/peripheral region, a bit line structure disposed on the substrate of the cell region and including a polysilicon structure, a barrier pattern, a metal pattern and a capping pattern that are stacked on each other, and a gate structure on the substrate of the core/peripheral region, the gate structure including a gate insulation pattern, a polysilicon pattern, a carbon-containing pattern, a barrier structure, a metal pattern and a capping pattern that are stacked on each other.

20 Claims, 24 Drawing Sheets

SEMICONDUCTOR DEVICE

CROSS-REFERENCE TO RELATED APPLICATION

This application claims priority under 35 USC § 119 to Korean Patent Application No. 10-2022-0141052, filed on Oct. 28, 2022, in the Korean Intellectual Property Office (KIPO), the contents of which are incorporated by reference herein in their entirety.

BACKGROUND

1. Field

Embodiments relate to a semiconductor device. More particularly, the embodiments relates to a DRAM (Dynamic random-access memory) device.

2. Description of the Related Art

In semiconductor devices, memory cells may be formed in a memory cell region, and transistors constituting core/peripheral circuits may be formed in a core/peripheral region. A bit line structure included in the memory cells may be formed to have low resistance. The transistors formed in the core/peripheral circuits may be formed to have target electrical characteristics.

SUMMARY

Example embodiments provide a semiconductor device having target characteristics.

According to example embodiments, a semiconductor device includes a substrate including a cell region and a core/peripheral region, a bit line structure disposed on the substrate of the cell region and including a polysilicon structure, a barrier pattern, a metal pattern and a capping pattern that are stacked on each other, and a gate structure on the substrate of the core/peripheral region, the gate structure including a gate insulation pattern, a polysilicon pattern, a carbon-containing pattern, a barrier structure, a metal pattern and a capping pattern that are stacked on each other.

According to example embodiments, a semiconductor device includes a substrate including a cell region and a core/peripheral region, a buried gate structure disposed in a gate trench at the substrate of the cell region and extending in a first direction parallel to an upper surface of the substrate, a bit line structure disposed on the buried gate structure and the substrate and extending in a second direction perpendicular to the first direction, a contact plug contacting the substrate and being spaced apart from the bit line structure, a capacitor contacting an upper surface of the contact plug, and a gate structure on the substrate of the core/peripheral region. The bit line structure includes a polysilicon structure, a first barrier pattern, a first metal pattern, and a first capping pattern that are sequentially stacked on each other. The gate structure includes a gate insulation pattern, a polysilicon pattern, a carbon-containing pattern, a second barrier pattern, a third barrier pattern, a second metal pattern, and a second capping pattern that are sequentially stacked on each other. The third barrier pattern of the gate structure and the first barrier pattern of the bit line structure include the same material. The second metal pattern of the gate structure and the first metal pattern of the bit line structure include the same material. The second capping pattern of the gate structure and the first capping pattern of the bit line structure include the same material.

According to example embodiments, a semiconductor device includes a substrate divided into a cell region and a core/peripheral region, the substrate including an isolation pattern and an active pattern, a buried gate structure disposed in a gate trench at the substrate of the cell region and extending in a first direction parallel to an upper surface of the substrate, buffer insulation patterns on the substrate of the cell region, a bit line structure contacting upper surfaces of the buffer insulation patterns and an upper surface of the active pattern between the buffer insulation patterns, the bit line structure extending in a second direction parallel to the upper surface of the substrate and perpendicular to the first direction, a contact plug contacting the active pattern and being spaced apart from the bit line structure, a capacitor contacting an upper surface of the contact plug, and a gate structure disposed on the substrate of the core/peripheral region and having a line width greater than a line width of the bit line structure. The bit line structure includes a polysilicon structure, a barrier pattern, a first metal pattern and a first capping pattern that are sequentially stacked on each other. The gate structure includes a gate insulation pattern, a polysilicon pattern, a carbon-containing pattern, a barrier structure, a second metal pattern and a second capping pattern that are sequentially stacked on each other. The first metal pattern of the bit line structure and the second metal pattern of the gate structure include the same material. The first capping pattern of the bit line structure and the second capping pattern of the gate structure include the same material.

In the semiconductor device according to example embodiments, the bit line structure may not include the carbon injection layer. A resistance of the bit line structure may not be increased due to the carbon injection layer. Accordingly, a resistance of the bit line structure may be decreased. The carbon injection layer may be further included between the first polysilicon pattern and the second barrier layer pattern in the gate structure on the core/peripheral region. An upward diffusion of impurities doped into the first polysilicon pattern in the gate structure may be prevented by the carbon injection layer. Accordingly, a transistor including the gate structure may have target electrical characteristics.

BRIEF DESCRIPTION OF THE DRAWINGS

Example embodiments will be more clearly understood from the following detailed description taken in conjunction with the accompanying drawings. FIGS. 1 to 24 represent non-limiting, example embodiments as described herein.

FIGS. 1 and 2 are a cross-sectional view and a plan view illustrating a semiconductor device according to example embodiments, respectively; and FIGS. 3 to 24 are plan views and cross-sectional views illustrating a method of manufacturing a semiconductor device according to example embodiments.

DESCRIPTION OF EMBODIMENTS

Hereinafter, embodiments of the present invention will be described in detail with reference to the accompanying drawings.

Figure 1:
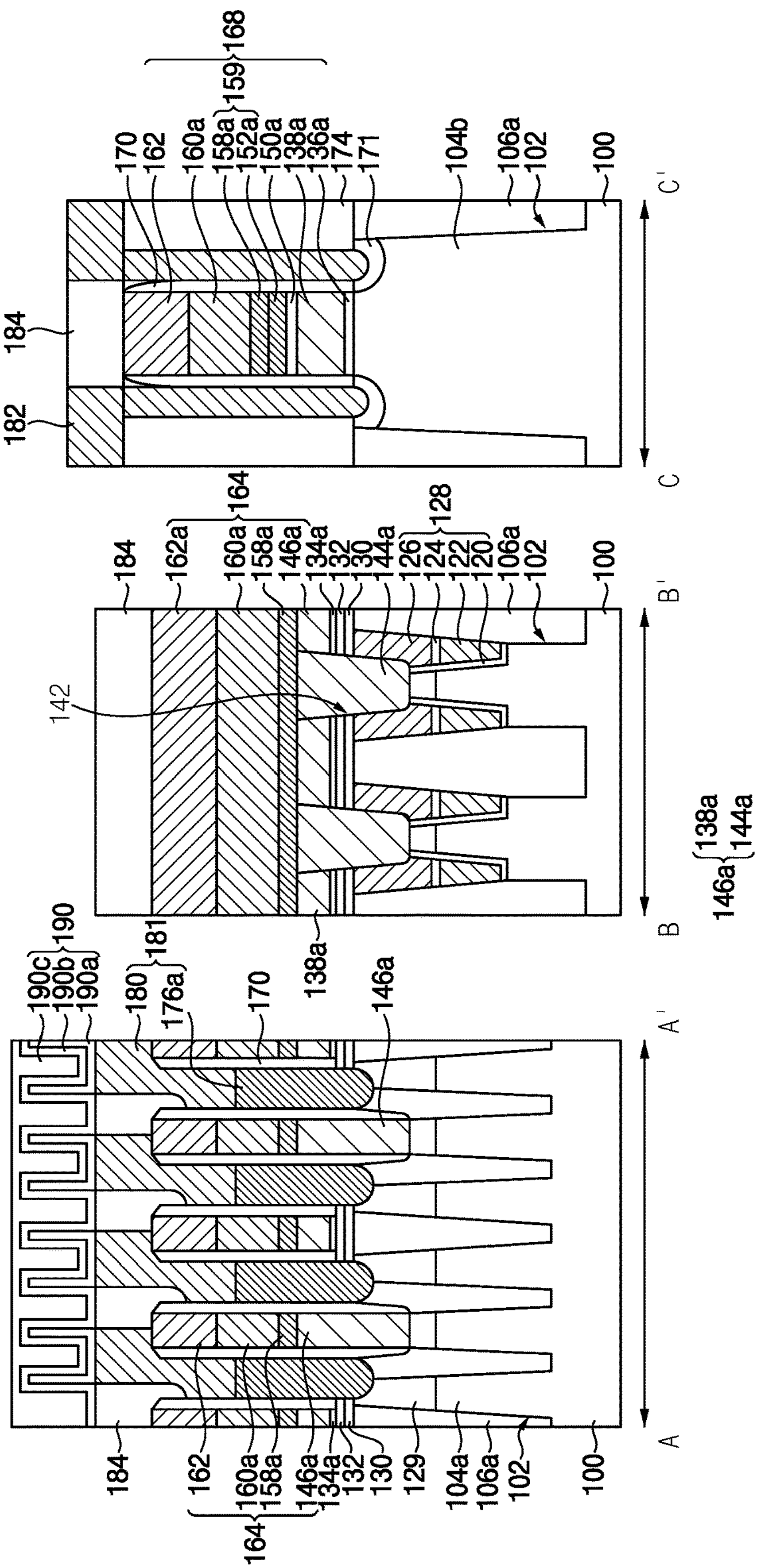
Figure 2:
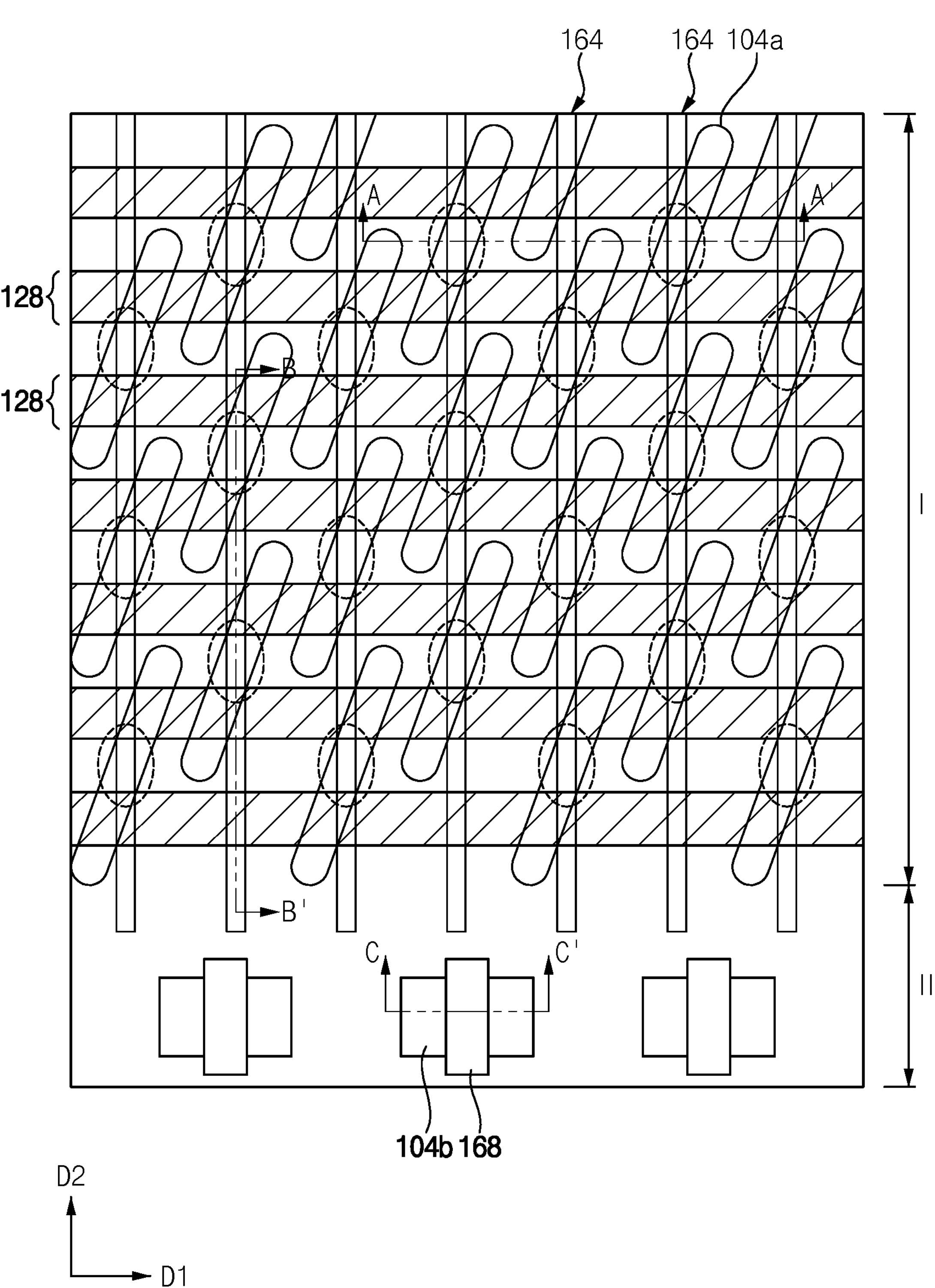

FIGS. 1 and 2 are a cross-sectional view and a plan view illustrating a semiconductor device according to example embodiments, respectively.

FIG. 1 shows cross-sectional views taken along lines A-A', B-B' and C-C' of FIG. 2. In order to avoid drawing complexity, only major components may be shown in the plan view of FIG. 2. For example, spacers, capacitors, or the like may be omitted.

Hereinafter, one direction parallel to a surface of a substrate may be referred to as a first direction, and a direction parallel to the surface of the substrate and perpendicular to the first direction is referred to as a second direction.

Referring to FIGS. 1 and 2, the semiconductor device may be formed on a substrate 100 including a cell region I and a core/peripheral region II. A buried gate structure 128, bit line structures 164, a spacer 170, a contact plug structure 181 and a capacitor 190 may be formed on the cell region I of the substrate 100. A transistor including a gate structure 168 and a second impurity region 171 and a wiring pattern 182 may be formed on the core/peripheral region II of the substrate 100.

The substrate 100 may include or may be formed of silicon, germanium, silicon-germanium, or a group III-V compound such as GaP, GaAs, and GaSb. In some example embodiments, the substrate 100 may be a Silicon On Insulator (SOI) substrate or a Germanium On Insulator (GOI) substrate.

A trench 102 for isolation may be formed on the substrate 100, and an isolation layer **106*a* may be formed in the trench 102. The isolation layer 106*a*** may include or may be formed of, e.g., an insulation material such as silicon oxide and silicon nitride.

In the cell region I, a protruding portion of the substrate 100 in which the trench 102 is not formed may be referred to as a first active pattern **104*a*. In the core/peripheral region II, a protruding portion of the substrate 100 in which the trench 102 is not formed may be referred to as a second active pattern 104*b*. A plurality of first active patterns 104*a* may be regularly arranged in a direction oblique to the first direction D1. An area of an isolated one of the second active patterns 104*b* may be larger than an area of an isolated one of the first active patterns 104*a*. An upper surface of the first active pattern 104*a* and an upper surface of the second active pattern 104*b*** may serve as first and second active regions, respectively.

In example embodiments, the first active region may have an isolated island shape. The first active region may be disposed such that the direction oblique to the first direction D1 is a longitudinal direction of the first active region.

Agate trench may be formed in the first active pattern **104*a* and the isolation layer 106*a*. The buried gate structure 128 may be formed in the gate trench. The buried gate structure 128 may extend in the first direction D1. The plurality of buried gate structures 128 may be spaced apart from each other in the second direction D2**.

The buried gate structure 128 may include a buried gate insulation layer 120, a buried gate pattern 122, a buried polysilicon pattern 124 and a first capping layer pattern 126.

The buried gate insulation layer 120 may be formed along an inner surface of the gate trench. The buried gate insulation layer 120 may include or may be formed of, e.g., silicon oxide. The buried gate pattern 122 may include or may be formed of metal. In example embodiments, the buried gate pattern 122 may include a barrier layer pattern and a metal pattern. The barrier layer pattern may include or may be formed of, e.g., titanium (Ti), tantalum (Ta), tungsten nitride, titanium nitride, tantalum nitride, or the like, and the metal pattern may include or may be formed of, e.g., tungsten. The first capping layer pattern 126 may include or may be formed of, e.g., silicon nitride.

A first impurity region 129 may be formed in an upper portion of the first active pattern **104*a* adjacent to opposite sides of the buried gate structure 128. In example embodiments, a bottom surface of the first impurity region 129 may be positioned at a height between upper and lower surfaces of the buried polysilicon pattern 124**.

A first buffer insulation layer 130, a second buffer insulation layer 132 and a third buffer layer pattern **134*a* may be sequentially stacked on an upper surfaces of the substrate 100, the isolation layer 106*a*, and the first capping layer pattern 126** in the cell region I.

The first buffer insulation layer 130 and the third buffer insulation layer pattern **134*a* may include or may be formed of, e.g., silicon oxide. The second buffer insulation layer 132** may include or may be formed of, e.g., silicon nitride.

The bit line structure 164 may be formed on the third buffer insulation layer pattern **134*a* and the first active pattern 104*a*** in the cell region I.

The bit line structure 164 may have a structure in which a polysilicon structure **146*a*, a second barrier layer pattern 158*a* (i.e., a first barrier pattern), a first metal pattern 160*a*, and a second capping layer pattern 162 are sequentially stacked. The bit line structure 164 may extend in the second direction D2. In the cell region, the polysilicon structure 146*a* included in the bit line structure 164 may include a first polysilicon pattern 138*a* and a second polysilicon pattern 144*a*. In some embodiments, a bottom surface of the second polysilicon pattern 114*a* may be lower than a bottom surface of the first polysilicon pattern 138*a*. The bottom surface of the second polysilicon pattern 114*a* may correspond to a bottommost surface of the polysilicon structure 146*a***.

A first portion of a bottom surface of the bit line structure 164 may contact the upper surface of the first active pattern **104*a*. A second portion of a bottom surface of the bit line structure 164 may contact an upper surface of the third buffer insulation layer pattern 134*a*. The first portion of the bit line structure 164 may contact a portion of the first active pattern 104*a*** corresponding to a center portion of the first active region in the longitudinal direction. The term "contact," as used herein, refers to a direct connection (i.e., touching) unless the context indicates otherwise.

The gate structure 168 may be formed on the substrate 100 and the isolation layer **106*a* in the core/peripheral region II. The second impurity region 171 may be formed in the substrate 100 adjacent to opposite sides of the gate structure 168**.

The gate structure 168 may include a gate insulation layer pattern **136*a*, a first polysilicon pattern 138*a* (i.e., a third polysilicon pattern 138*a*), a carbon injection layer pattern 150*a* (i.e., a carbon-containing pattern), a first barrier layer pattern 152*a* (i.e., a second barrier pattern), a second barrier layer pattern 158*a* (i.e., a third barrier pattern), a first metal pattern 160*a*, and a second capping layer pattern 162 that are sequentially stacked on each other. A line width of the gate structure 168 may be greater than a line width of the bit line structure 164. In example embodiments, the first and second barrier layer patterns 152*a* and 158*a* may include or may be formed of the same material. In some embodiments, the first polysilicon pattern 138*a* of the gate structure 168 and the first polysilicon pattern 138*a* of the bit line structure 164 may be formed of the same material. In some embodiments, the second barrier layer pattern 158*a* of the gate structure 168 and the second barrier layer pattern 158*a* of the bit line structure 164** may be formed of the same material. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first and second polysilicon patterns 138*a* and 144*a* may include or may be formed of polysilicon doped with N-type or P-type impurities. Each of an upper surface of the polysilicon structure 146*a* on the cell region and an upper surface of the first polysilicon pattern 138*a* on the core/peripheral region II may be substantially flat. Terms such as "same," "equal," "planar," "flat" or "coplanar," as used herein encompass near identicality including variations that may occur, for example, due to manufacturing processes. The term "substantially" may be used herein to emphasize this meaning, unless the context or other statements indicate otherwise.

In example embodiments, the upper surfaces of the polysilicon structure 146*a* on the cell region I and the first polysilicon pattern 138*a* on the core/peripheral region II may be coplanar with each other. In some example embodiments, an upper surface of the polysilicon structure 146*a* on the cell region I may be lower than an upper surface of the first polysilicon pattern 138*a* on the core/peripheral region II.

In example embodiments, in the core/peripheral region II, the first polysilicon pattern 138*a* in a region where the P-type transistor is formed may be doped with a P-type impurity, and the first polysilicon pattern 138*a* in a region where the N-type transistor is formed may be doped with N-type impurities. The P-type impurity may include, e.g., boron or aluminum. The N-type impurity may include, e.g, arsenic, phosphorus, or the like.

In the cell region I, the polysilicon structure 146*a* may extend in the second direction, and may contact the upper surfaces of the first active pattern 104*a* and the third buffer insulation layer pattern 134*a*. In the core/peripheral region II, the first polysilicon pattern 138*a* may be formed on the upper surfaces of the second active pattern 104*b* and the isolation layer 106*a*.

As the bit line structure 164 may serve as a data signal transmission line, the bit line structure 164 may have low resistance. The bit line structure 164 may not include the carbon injection layer pattern 150*a* and the first barrier layer pattern 152*a*. As a carbon injection layer pattern may not be included in the bit line structure 164, a resistance of the bit line structure 164 may not be increased due to the carbon injection layer pattern. Accordingly, the resistance of the bit line structure 164 may be decreased.

In example embodiments, the gate structure may not serve as a line for data signal transmission, but may serve as one switching element of the transistor. Therefore, even if a resistance of the gate structure 168 is increased, characteristics of the transistor may not change significantly.

The carbon injection layer pattern 150*a* may be formed only on an upper surface of the first poly silicon pattern 138*a* included in the gate structure 168 on the core/peripheral region II. The carbon injection layer pattern 150*a* may include or may be formed of polysilicon doped with dopants such as carbon.

As the gate structure 168 on the core/peripheral region II may have the line width greater than the line width of the bit line structure 164 on the cell region I, defects of the gate structure 168 due to out-diffusion of impurities doped into the first polysilicon pattern 138*a* may occur significantly. For example, when the impurity doped into the first polysilicon pattern 138*a* includes boron, out-diffusion of the boron may greatly occur. The carbon injection layer pattern 150*a* may prevent the impurities doped into the first polysilicon pattern 138*a* from being out diffused upward to patterns (i.e., the first metal pattern) including a metal on the first polysilicon pattern 138*a*. As the carbon injection layer pattern 150*a* is formed on the first polysilicon pattern 138*a*, defects (e.g., variation of threshold voltage) due to diffusion of impurities doped into the first polysilicon pattern 138*a* in the gate structure 168 may be decreased. Also, on-currents of the transistor formed in the core/peripheral region II may be increased.

The second barrier layer pattern 158*a* may be formed on the bit line structure 164, and the first barrier layer pattern 152*a* and the second barrier layer pattern 158*a* may be formed on the gate structure 168. As such, the gate structure 168 may further include the first barrier layer pattern 152*a*.

The first barrier pattern 152*a* and the second barrier pattern 158*a* may be merged into a barrier structure 159. The second barrier layer pattern 158*a* included in the bit line structure 164 may have a thickness less than a thickness of the barrier structure 159 included in the gate structure 168.

The carbon injection layer pattern 150*a* may have a thickness less than the thickness of the first barrier layer pattern 152*a*. Also, the carbon injection layer pattern 150*a* may have the thickness less than the thickness of the second barrier layer pattern 158*a*. Amount of carbon included in the carbon injection layer pattern 150*a* may be selected from a range of about 1 atomic % to about 10 atomic %. When the amount of carbon included in the carbon injection layer pattern 150*a* is 10% or more, the resistance of the gate structure 168 may increase. When the amount of carbon included in the carbon injection layer pattern 150*a* is less than 1%, it may be difficult to prevent the out-diffusion of impurities. Therefore, the amount of carbon included in the first barrier layer pattern 152*a* may be in the range of about 1% to about 10%. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In example embodiments, the carbon injection layer pattern 150*a* may be carbon-doped polysilicon. In example embodiments, the carbon injection layer pattern 150*a* may be polysilicon doped with carbon atoms and further including nitrogen. Amount of nitrogen included in the carbon injection layer pattern 150*a* may be about 1 atomic % to about 10 atomic %.

The first barrier layer pattern 152*a* may cover the carbon injection layer pattern 150*a*, so that the carbon atoms included in the carbon injection layer pattern 150*a* may remain on the first polysilicon pattern 138*a* without removing. In some embodiments, the carbon atoms of the carbon injection layer pattern 150*a* may be present as atoms themselves without chemically interacting with other elements in the carbon injection layer pattern 150*a*. For example, the carbon atoms and other elements (e.g., silicon) of the carbon injection layer pattern 150*a* may form a mixture, not a chemical compound. In addition, the first barrier layer pattern 152*a* may prevent metal included in the first metal pattern 160*a* from being out diffused.

The first barrier layer pattern 152*a* may include or may be formed of a metal, e.g., a tantalum-containing layer, a titanium-containing layer, or a tungsten-containing layer. In example embodiments, the first barrier layer pattern 152*a* may include or may be formed of, e.g., silicon-doped titanium nitride (TiSiN), Ti, TiN, TiAl, TiAlN, TiSi, TaC, TaCN, TaSiN, Ta, TaN, or WN.

The second barrier layer pattern 158*a* may prevent metal included in the first metal pattern 160*a* thereon from diffusing.

In example embodiments, the second barrier layer pattern 158*a* may include or may be formed of, e.g., silicon-doped titanium nitride (TiSiN), Ti, TiN, TiAl, TiAlN, TiSi, TaC, TaCN, TaSiN, Ta, TaN, or WN.

For example, the second barrier layer pattern 158*a* included in the bit line structure 164 and the barrier structure 159 included in the gate structure 168 may include or may be formed of silicon-doped titanium nitride (TiSiN).

In example embodiments, the second barrier layer pattern 158*a* may have a thickness of about 10 Å to about 50 Å. When the thickness of the second barrier layer pattern 158*a* is less than 10 Å, it is not easy to be prevented from the diffusion of metal by the second barrier layer pattern 158*a*. When the thickness of the second barrier layer pattern 158*a* is greater than 50 Å, a resistance of the bit line structure 164 may increase. For example, the second barrier layer pattern 158*a* may have the thickness of about 25 Å to about 35 Å.

The first metal pattern 160*a* may include or may be formed of a metal material having a resistance lower than a resistance of the second barrier layer pattern 158*a*. For example, the first metal pattern 160*a* may include or may be formed of tungsten. As the first metal pattern 160*a* is formed, a total resistance of the bit line structure 164 may be decreased.

The second capping layer pattern 162 may include or may be formed of silicon nitride.

A portion of the first active pattern 104*a* contacting the bit line structure 164 may be recessed rather than an upper surface of the first active pattern 104*a* positioned under the first buffer insulation layer 130. A first opening 142 may be formed at a portion of the first active pattern 104*a*, and a bottom surface of the first opening 142 and a bottom surface of the bit line structure 164 may contact each other.

In the cell region I, the spacer 170 may be formed on sidewalls of the bit line structure 164 and the third buffer insulation layer pattern 134*a*. In the core/peripheral region II, the spacers 170 may be formed on sidewalls of the gate structure 168.

Upper surfaces of the first active pattern 104*a* and the isolation layer 106*a* positioned between the bit line structures 164 may also have a partially recessed shape.

Figure 21:
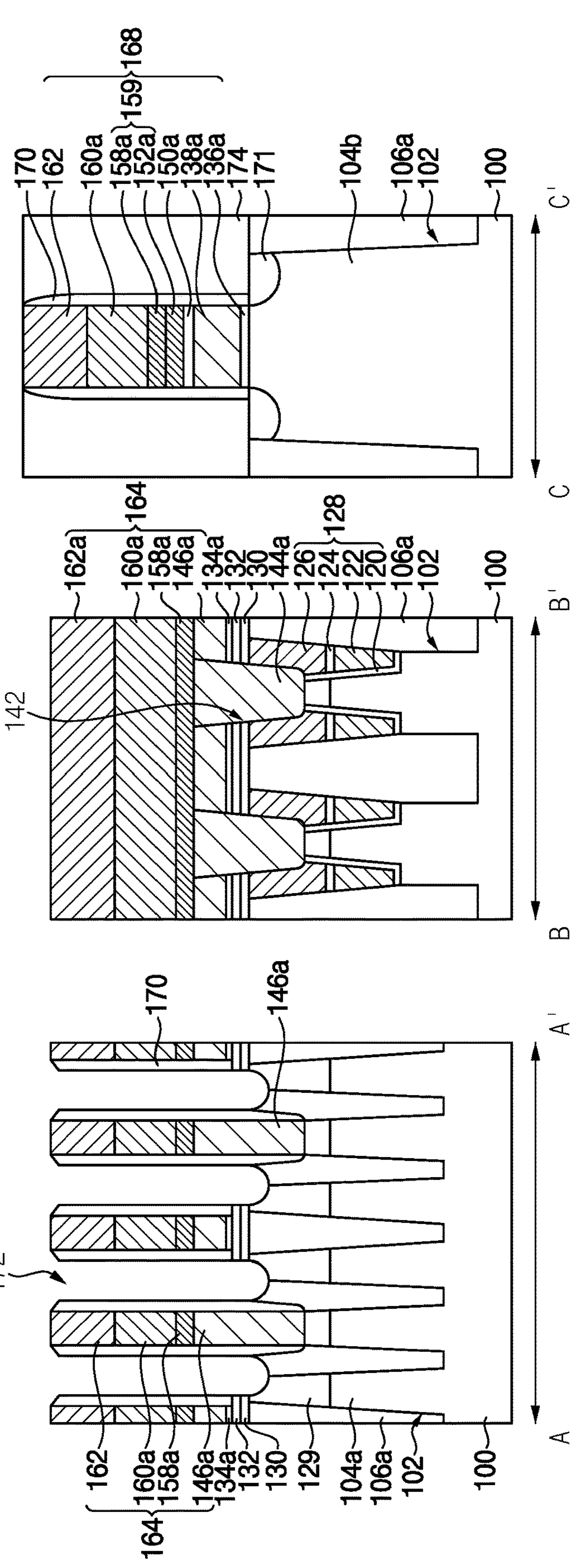

In the cell region I, insulation patterns (not shown) may be formed between the bit line structures 164. The insulation patterns may include or may be formed of, e.g., nitride such as silicon nitride. A second opening 172 (referred to FIG. 21) may be defined as a space between the bit line structures 164 and the insulation patterns. Upper surfaces of edges of the first active region in the longitudinal direction may be exposed by a bottom surface of each of the second openings 172.

A lower contact plug 176*a* may contact the first active pattern 104*a* exposed by the bottom surface of the second opening 172, and the lower contact plug 176*a* may fill a lower portion of the second opening 172. The lower contact plug 176*a* may include or may be formed of polysilicon doped with N-type impurities.

An upper contact plug 180 may be formed on the lower contact plug 176*a*, and an upper surface of the upper contact plug 180 may be higher than an upper surface of the bit line structure 164. The contact plug structure 181 may include the lower contact plug 176*a* and the upper contact plug 180. An upper surface of the contact plug structure 181 may be higher than the upper surface of the bit line structure 164. A third opening may be formed between the upper contact plugs 180, and an upper insulating pattern 184 may be formed in the third opening.

In the core/peripheral region II, a first insulating interlayer 174 may be between the gate structures 168. A wiring pattern 182 may be formed inside and on the first insulating interlayer 174. The wiring pattern 182 may include contact plugs contacting the second impurity regions 171 adjacent to the opposite sides of the gate structure 168 and passing through the first insulating interlayer 174 and contact patterns contacting the contact plugs on the first insulating interlayer 174.

The upper contact plug 180 and the wiring pattern 182 may have the same stacked structure, and may include or may be formed of a metal having a resistance lower than a resistance of the polysilicon.

In example embodiments, the upper contact plug 180 and the wiring pattern 182 may include a barrier layer pattern and a metal pattern. The upper contact plug 180 may serve as a pad electrode electrically connected to a lower electrode 190*a* of the capacitor 190.

The capacitor 190 may contact an upper surface of the upper contact plug 180. The capacitor 190 may have a structure in which the lower electrode 190*a*, a dielectric layer 190*b*, and an upper electrode 190*c* are stacked.

In the semiconductor device, the bit line structure 164 on the cell region I may include the polysilicon structure 146*a*, the second barrier layer pattern 158*a*, the first metal pattern 160*a*, and the second capping layer pattern 162 that are sequentially stacked on each other. The gate structure 168 on the core/peripheral region II may include the first polysilicon pattern 138*a*, the carbon injection layer pattern 150*a*, the first barrier layer pattern 152*a*, the second barrier layer pattern 158*a*, the first metal pattern 160*a*, and the second capping layer pattern 162 that are sequentially stacked on each other. The bit line structure 164 may have low resistance. In the gate structure 168 on the core/peripheral region II, the diffusion of impurities doped into the first polysilicon pattern 138*a* may be prevented.

Figure 3:
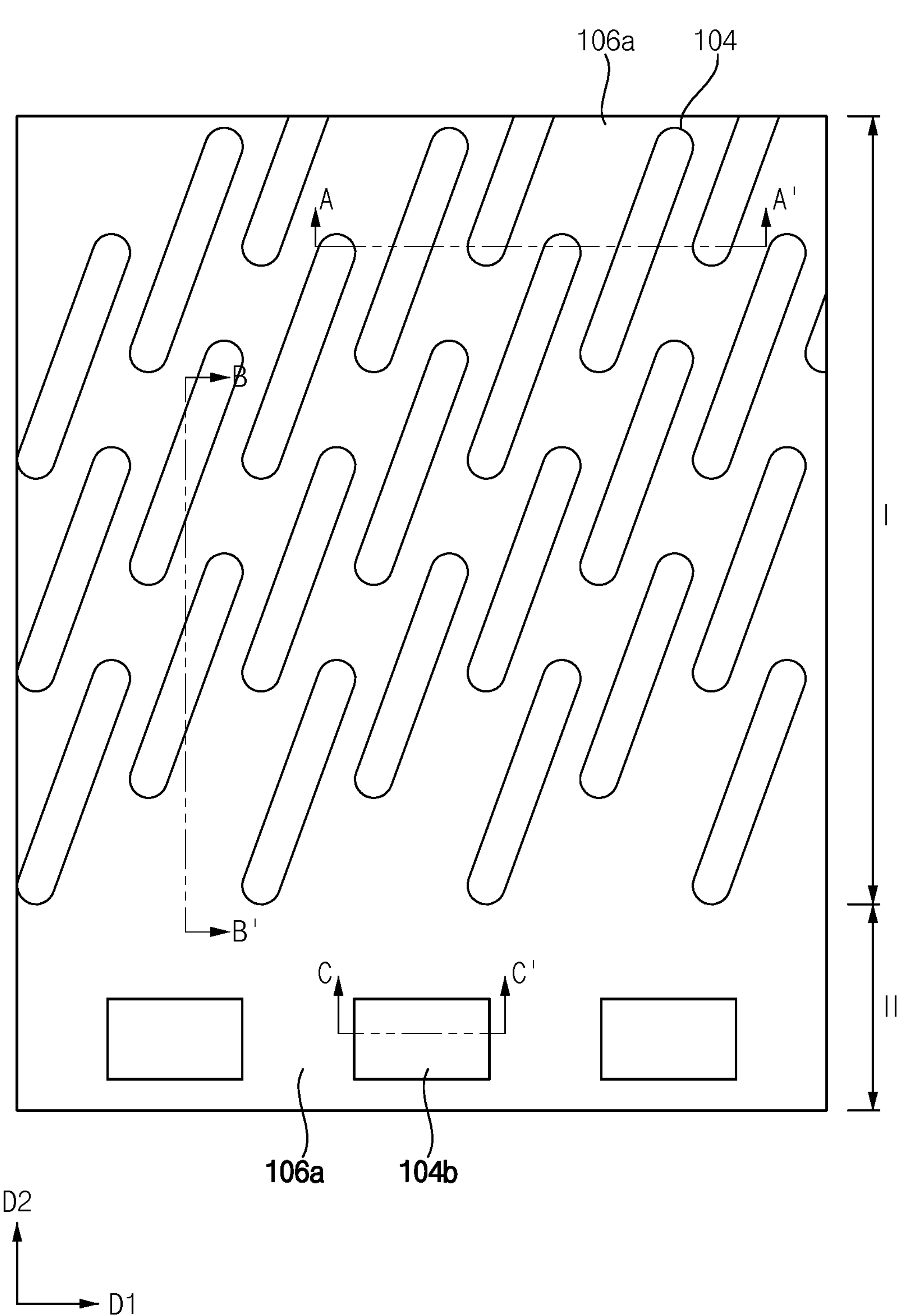

FIGS. 3 to 24 are plan views and cross-sectional views illustrating a method of manufacturing a semiconductor device according to example embodiments. FIGS. 3, 5 and 19 are plan views, and FIGS. 4, 6 to 18, and 20 to 24 are cross-sectional views. Each of FIGS. 4, 6 to 18, and 20 to 24 shows cross-sectional views cut along lines A-A', B-B', and C-C' of the plan views.

Figure 4:
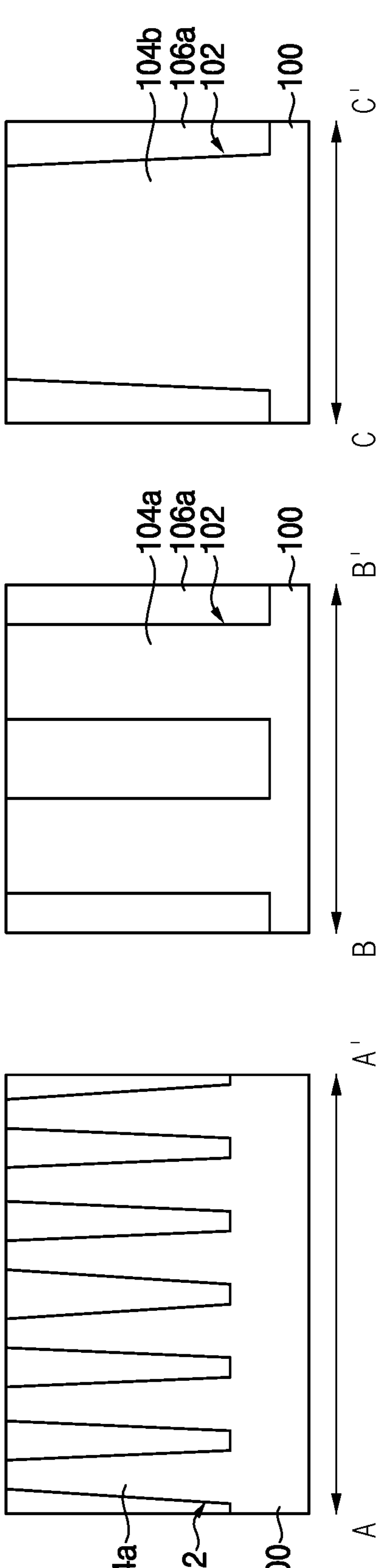
Figure 5:
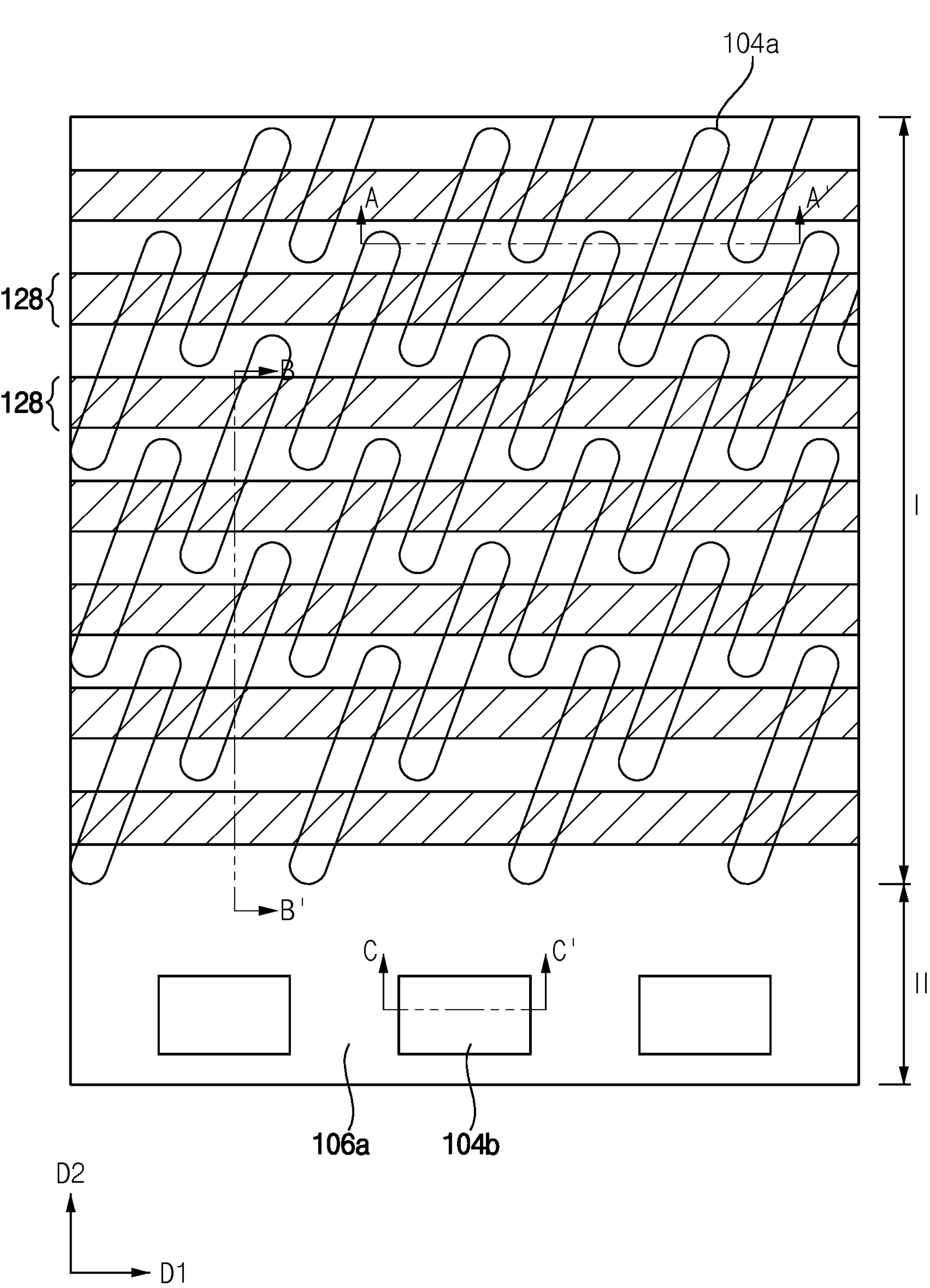

Referring to FIGS. 3 and 4, a substrate 100 may include a cell region I and a core/peripheral region II. A first mask pattern (not shown) may be formed on the cell region I and the core/peripheral region II of the substrate 100.

The first mask pattern may selectively cover a region corresponding to an active region. The substrate 100 may be etched using the first mask pattern as an etching mask to form a trench 102 for isolation at a field region. In the cell region I, a protruding portion of the substrate 100 between the trenches 102 may serve as a first active pattern 104*a*. In the core/peripheral region II, a protruding portion of the substrate 100 between the trenches 102 may serve as the second active pattern 104*b*.

An isolation layer 106*a* may be formed to fill the trench 102. The isolation layer 106*a* may be formed to completely fill the trench 102. After that, an upper surface of the isolation layer 106*a* may be planarized by a planarization process. The planarization process may include a chemical mechanical polishing (CMP) and/or etch-back process.

The isolation layer 106*a* may include or may be formed of an insulation material such as silicon oxide and silicon nitride. The isolation layer 106*a* may include a single insulation material or two or more insulation materials stacked. For example, the isolation layer 106*a* may include or may be formed of silicon oxide.

In example embodiments, before forming the isolation layer 106*a*, a polysilicon layer (not shown) may be conformally formed on surfaces of the trench 102 and the substrate 100, and the polysilicon layer may be thermally oxidized to form an oxide layer (not shown) on the surfaces of the trench 102 and the substrate 100.

Figure 6:
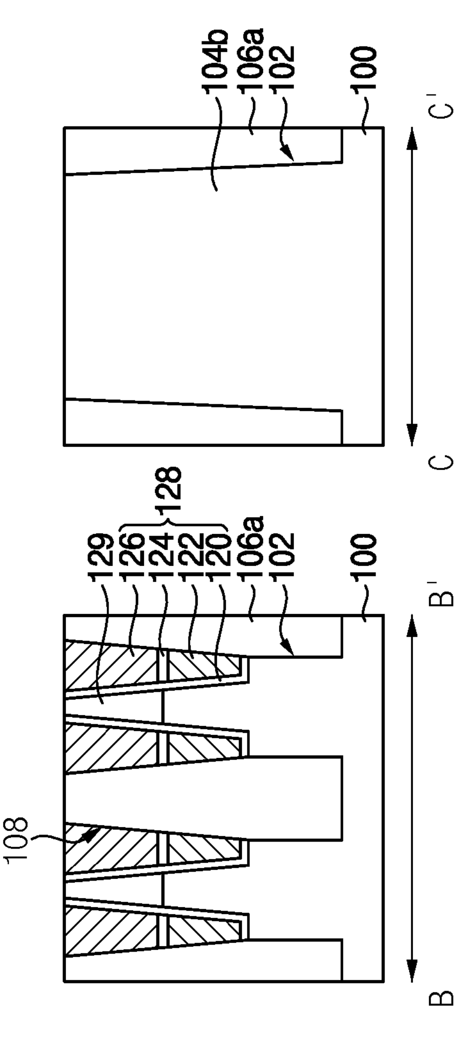
Figure 6:
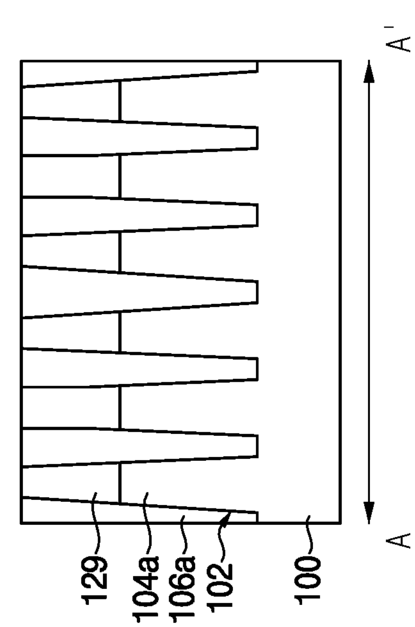

Referring to FIGS. 5 and 6, second mask patterns (not shown) for forming gate trenches 108 may be formed on the substrate 100 of the cell region I and the core/peripheral region II.

The second mask pattern may extend in the first direction D1. The second mask pattern may expose a region where a buried gate structure 128 may be formed. That is, a region between the second mask patterns may be the region where the buried gate structure 128 may be formed.

The upper portions of the isolation layer 106*a* and the substrate 100 in the cell region I may be etched using the second mask pattern as an etch mask to form the gate trench 108 extending in the first direction.

A buried gate insulation layer 120 may be formed along a surface of the gate trench 108, and a buried gate electrode layer may be formed on the buried gate insulation layer 120. Thereafter, the buried gate electrode layer may be etched back to form a buried gate pattern 122 in a lower portion of the gate trench 108.

In example embodiments, the buried gate pattern 122 may include a barrier metal pattern and a metal pattern. In example embodiments, a buried polysilicon pattern 124 may be further formed on the buried gate pattern 122.

A first capping layer may be formed on the buried polysilicon pattern 124 to completely fill the gate trench 108. The first capping layer may include or may be formed of silicon nitride.

The first capping layer may be partially removed so as to remain only in the gate trench 108. Therefore, a first capping layer pattern 126 may be formed in the gate trench 108. The removing process may include etch-back or chemical mechanical polishing.

As described above, a buried gate structure 128 including the buried gate insulation layer 120, the buried gate pattern 122, the buried polysilicon pattern 124 and the first capping layer pattern 126 may be formed in the gate trench 108.

After that, the second mask pattern may be removed. Accordingly, upper surfaces of the substrate 100, the isolation layer 106*a*, and the first capping layer pattern 126 may be exposed.

N-type impurities may be doped into the upper portion of the substrate 100 adjacent to opposite sides of the buried gate structure 128 to form a first impurity region 129. In example embodiments, a bottom surface of the first impurity region 129 may be positioned at a height between an upper surface and a lower surface of the buried polysilicon pattern 124.

Figure 7:
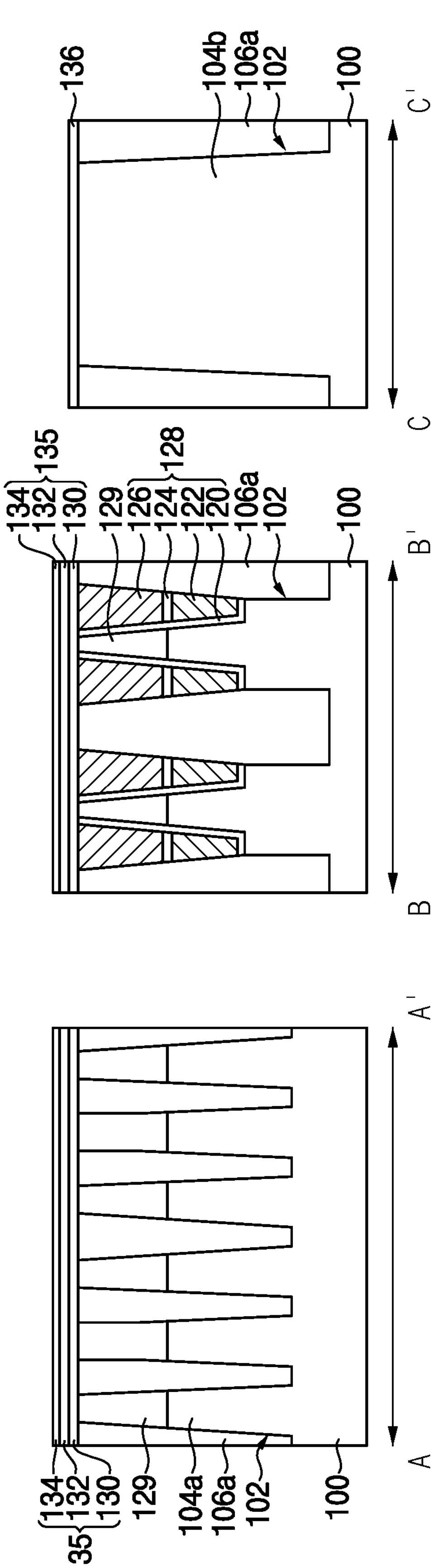

Referring to FIG. 7, a first buffer insulation layer 130, the second buffer insulation layer 132, the third buffer insulation layer 134 may be sequentially stacked on the upper surfaces of the first active pattern 104*a*, the isolation layer 106*a* and the first capping layer pattern 126 on the cell region I to form a buffer insulation structure. In addition, a gate insulation layer 13 may be formed on the upper surfaces of the second active pattern 104*b* and the isolation layer 106*a* on the core/peripheral region II.

The first to third buffer insulation layers 130, 132, and 134 may isolate conductive patterns (e.g., bit lines) thereon and first active pattern thereunder from each other.

The first and third buffer insulation layers 130 and 134 may include or may be formed of silicon oxide. The first and third buffer insulation layers 130 and 134 may be formed by an atomic layer deposition process. The second buffer insulation layer 132 may serve as an etch stop layer. The second buffer insulation layer 132 may include or may be formed of an insulation material having high etch selectivity with respect to silicon oxide. The second buffer insulation layer 132 may include or may be formed of, e.g., silicon nitride. The second buffer insulation layer 132 may be formed by an atomic layer deposition process.

The gate insulation layer 136 may include or may be formed of silicon oxide. The gate insulation layer 136 may have a thickness less than a thickness of the buffer insulation structure 135. Accordingly, an upper surface of the buffer insulation structure 135 may be higher than an upper surface of the gate insulation layer 136.

Figure 8:
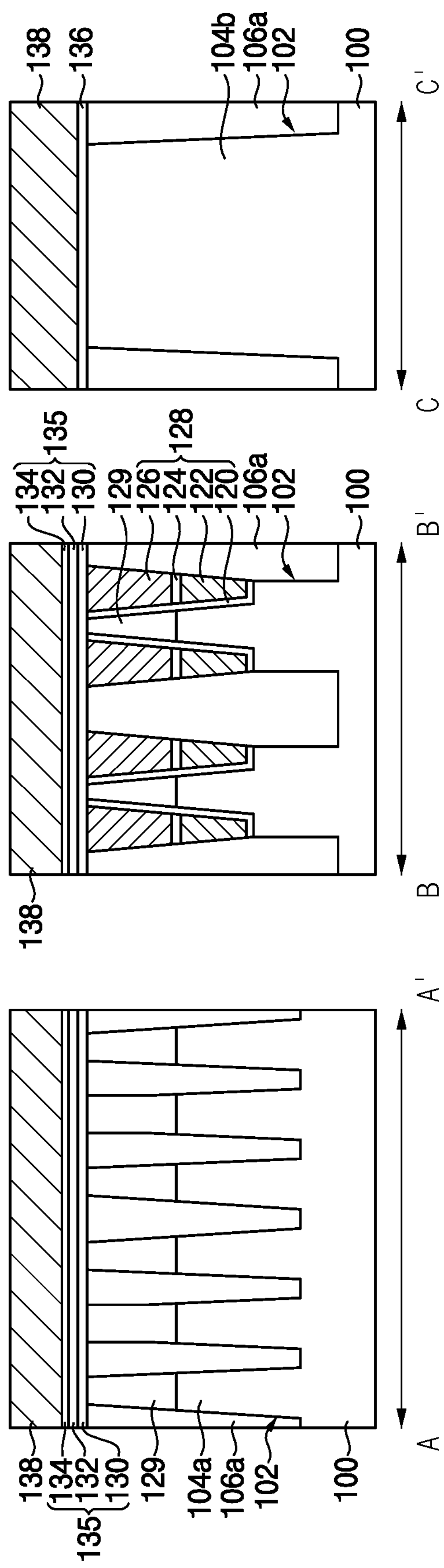

Referring to FIG. 8, a first polysilicon layer 138 may be formed on the third buffer insulation layer 134 and the gate insulation layer 136. The first polysilicon layer 138 may be doped with N-type or P-type impurities depending on regions thereof.

After forming the first polysilicon layer 138, a planarization process of an upper surface of the first polysilicon layer 138 may be further performed. The planarization process may include a chemical mechanical polishing process. Accordingly, upper surfaces of the first polysilicon layer 138 on the cell region I and the core/peripheral region II may be coplanar with each other, and may be substantially flat.

In example embodiments, the first polysilicon layer 138 on the cell region I may be doped with N-type impurities. In example embodiments, in the core/peripheral region II, the first polysilicon layer 138 in a region where the P-type transistor is formed may be doped with a P-type impurity, and the first polysilicon layer 138 in a region where the N-type transistor is formed may be doped with N-type impurities.

The first polysilicon layer 138 on the cell region I may be formed as a lower portion of the bit line structure by subsequent processes. The first polysilicon layer 138 on the core/peripheral region II may be formed as a gate pattern of the transistor constituting a core/peripheral circuit.

Since the upper surface of the buffer insulation structure 135 is higher than the upper surface of the gate insulating layer 136, a thickness of the first polysilicon layer 138 on the cell region I may be less than a thickness of the first polysilicon layer 138 on the core/peripheral region II.

Figure 9:
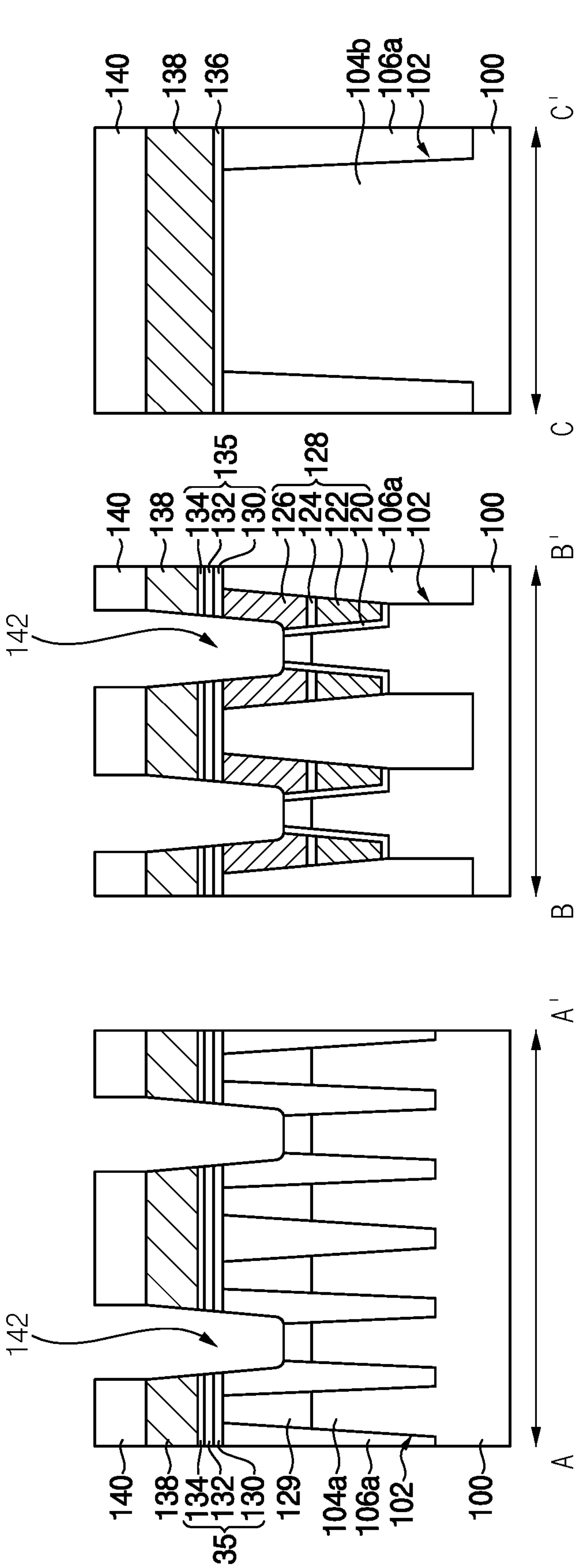

Referring to FIG. 9, a third mask pattern 140 may be formed on the first polysilicon layer 138. The third mask pattern 140 may selectively expose a portion for forming a bit line contact. The third mask pattern 140 may include or may be formed of, e.g., silicon oxide.

The first polysilicon layer 138, the third buffer insulation layer 134, the second buffer insulation layer 132 and the first buffer insulation layer 130 may be etched using the third mask pattern 140 as an etching mask. Subsequently, an exposed first active pattern 104*a*, the isolation layer 106*a* adjacent thereto, and an upper portion of the buried gate structure 128 may be etched together to form a first opening 142.

An upper surface of a center portion of the first active region in a longitudinal direction may be exposed by a bottom surface of the first opening 142. Due to the etching process, the upper surface of the first active pattern 104*a* exposed by the bottom surface of the first opening 142 may be lower than the upper surface of the first active pattern 104*a* in another region.

The third mask pattern 140 may entirely cover the first polysilicon layer 138 on the core/peripheral region II. Therefore, the first opening 142 may not be formed in the first polysilicon layer 138 on the core/peripheral region II.

Figure 10:
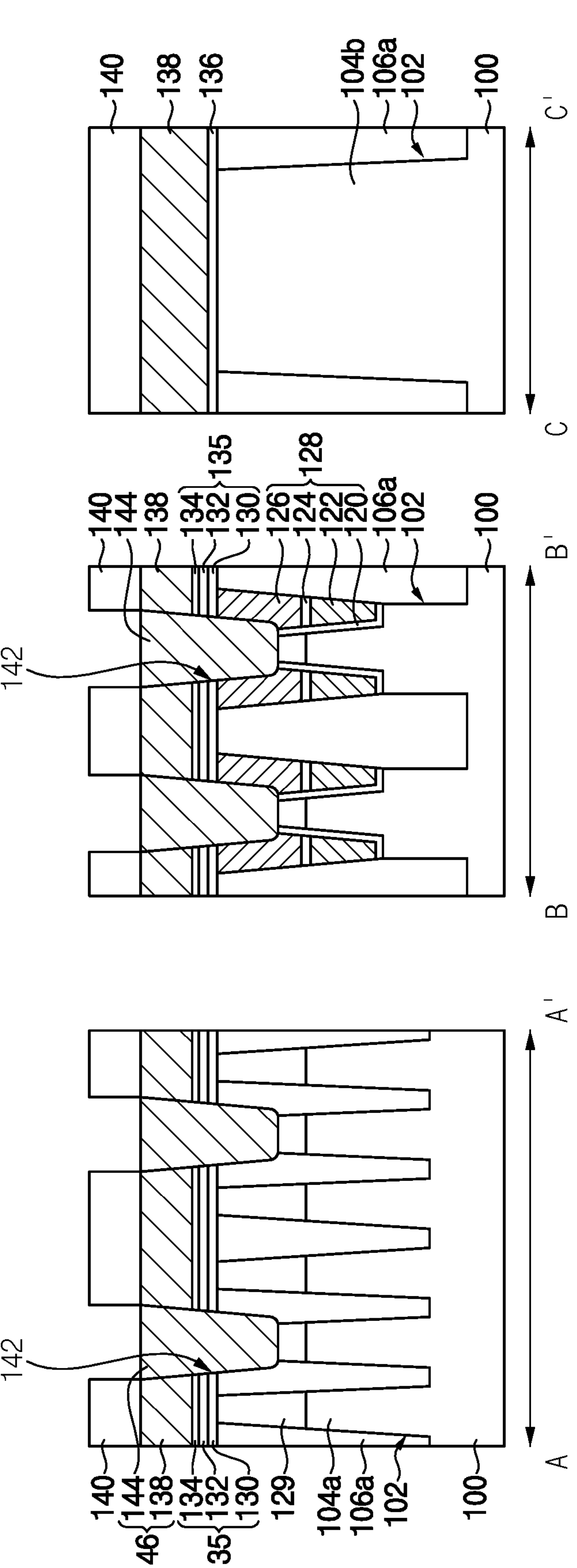

Referring to FIG. 10, a preliminary second polysilicon layer may be formed on the third mask pattern 140 to completely fill the first opening 142. The preliminary second polysilicon layer may include or may be formed of polysilicon doped with N-type or P-type impurities. The first polysilicon layer 138 and the preliminary second polysilicon layer may include or may be formed of substantially the same polysilicon layer that is formed of polysilicon, and thus the first polysilicon layer 138 and the preliminary second polysilicon layer may be merged with each other.

Thereafter, an upper portion of the preliminary second polysilicon layer may be etched back to form a second polysilicon layer 144 in the first opening 142.

After performing the etch-back process, an upper surface of the second polysilicon layer 144 may be positioned at substantially the same height as the upper surface of the first polysilicon layer 138. When the etch-back process is performed, all of the second polysilicon layer 144 formed on the third mask pattern 140 may be removed.

Figure 11:
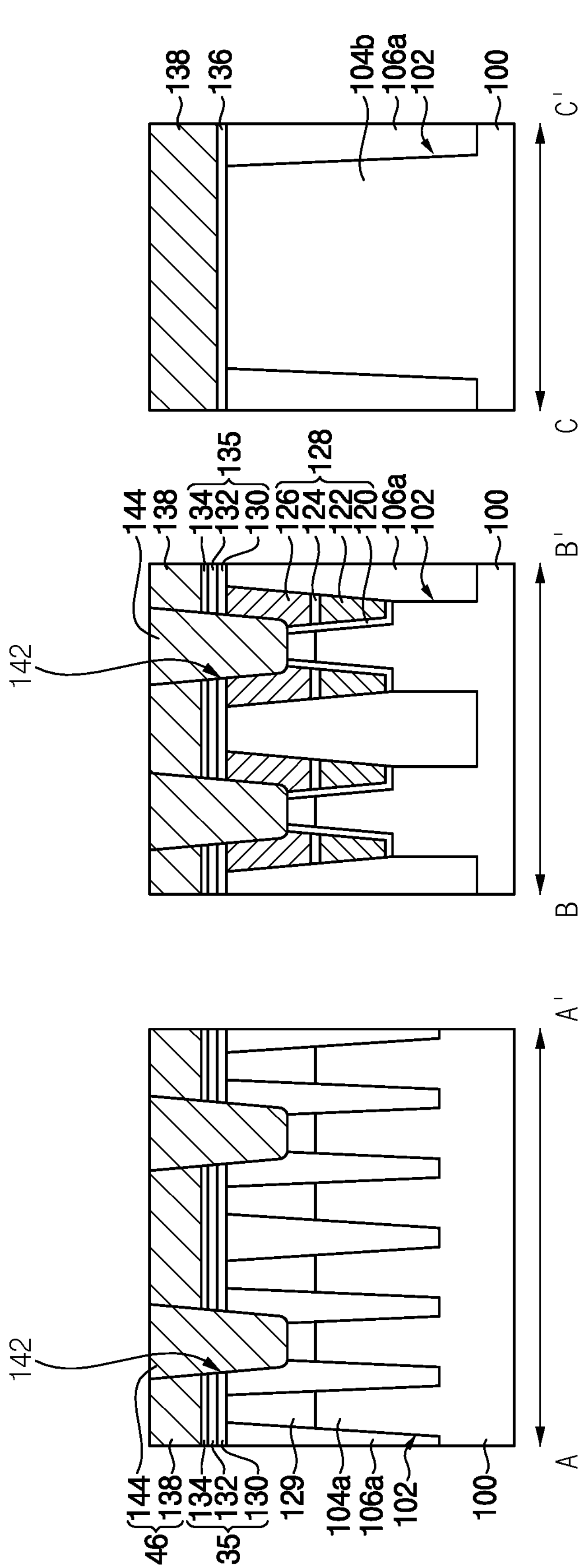

Referring to FIG. 11, the third mask pattern 140 may be removed. In example embodiments, the removing process may include a wet etching process. Accordingly, in the cell region I, the first polysilicon layer 138 may be formed on the third buffer insulation layer 134, and the second polysilicon layer 144 may be formed in the first opening 142. The first polysilicon layer 138 and the second polysilicon layer 144 on the cell region I may be merged into a single layer of a preliminary polysilicon structure 146. The second polysilicon layer 144 may contact the upper surface of the first active pattern 104*a*.

Figure 12:
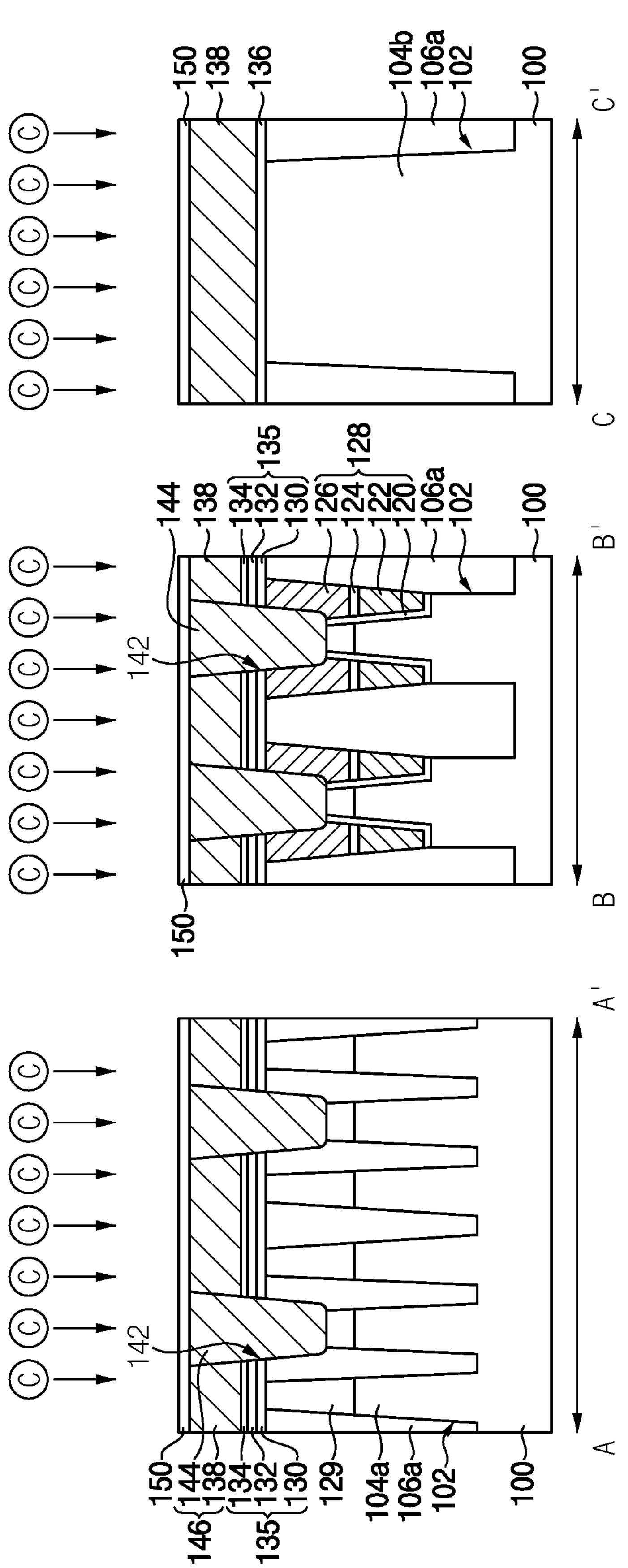

Referring to FIG. 12, carbon atoms may be implanted into the surfaces of the preliminary polysilicon structure 146 and the first polysilicon layer 138 to form a carbon injection layer 150 on upper surfaces of the preliminary polysilicon structure 146 and the first polysilicon layer 138. The carbon injection layer 150 may include or may be formed of polysilicon doped with dopants such as carbon. The carbon injection layer 150 may not include metal.

The carbon injection layer 150 on the core/peripheral region II may prevent impurities doped into the first polysilicon layer 138 positioned thereunder from diffusing.

In example embodiments, the carbon injection layer 150 may be formed by a doping process using a source gas containing dopants such as carbon. The carbon injection layer 150 may be formed by a gas phase doping process or an ion implantation process. When the gas phase doping process is performed, carbon atoms may be doped in the gas phase only on the surfaces of the preliminary polysilicon structure 146 and the first polysilicon layer 138, so that the carbon injection layer 150 may be formed to have a thin thickness. For example, the carbon injection layer 150 may have the thickness less than a thickness of a first barrier layer subsequently formed. Also, the carbon injection layer 150 may have the thickness less than a thickness of a second barrier layer subsequently formed.

Source gases used in the doping process may include dopants such as carbon, and may further include H, N, and/or Si. For example, the source gases may include DIPAS (diisopropylaminosilane), CH4, C2H4, C2H6, C3H6, C3H8, or the like.

In example embodiments, the gas phase doping process may be performed at a process temperature selected from a range of about 450° C. to about 500° C. When the gas phase doping process is performed at a temperature lower than 450° C., decomposition of the source gas may be difficult. When the gas phase doping process is performed at a temperature higher than 500° C., the source gas may not be doped at only the surface of a layer, and doping depth of the source gas may be increased.

In example embodiments, the carbon injection layer 150 may include or may be formed of polysilicon doped with carbon.

In example embodiments, the carbon injection layer 150 may be a polysilicon layer that is doped with carbon and nitrogen. The nitrogen included in the carbon injection layer 150 may be doped by the source gas. Alternatively, the nitrogen included in the carbon injection layer 150 may be doped by diffusing of the nitrogen from a barrier layer subsequently formed. In some embodiments, the carbon and nitrogen may be present in the carbon injection layer 150 as a mixture with silicon atoms.

Figure 13:
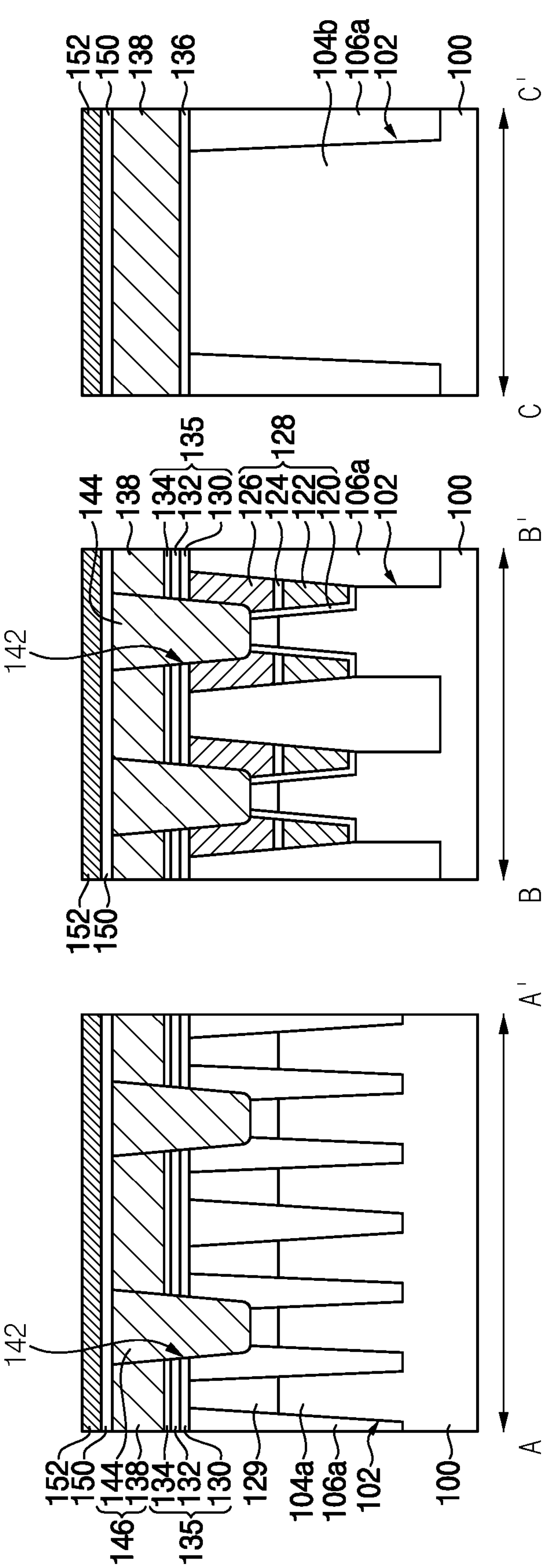

Referring to FIG. 13, a first barrier layer 152 may be formed on the carbon injection layer 150.

The carbon included in the carbon injection layer 150 may be easily removed. Therefore, the carbon may be difficult to stably remain on the upper surfaces of the preliminary polysilicon structure 146 and the first polysilicon layer 138. After forming the carbon injection layer 150, the first barrier layer 152 may be immediately formed on the carbon injection layer 150 without performing other processes. In some embodiments, the forming of the carbon injection layer 150 and the forming of the first barrier layer 152 may be performed in-situ. Thus, the carbon included in the carbon injection layer 150 may remain on the preliminary polysilicon structure 146 and the first polysilicon layer 138 without removing. If processes such as cleaning, rinsing, developing, and ashing process are performed after forming the carbon injection layer 150, all of the carbon may be undesirably removed during the processes. Thus, the processes may not be performed on the carbon injection layer 150. For example, after forming the carbon injection layer 150, a photo process including an ashing process and a cleaning process may not be performed. The first barrier layer 152 may cover an upper surface of the carbon injection layer 150 so that the carbon included in the carbon injection layer 150 may not be removed.

In addition, the first barrier layer 152 may prevent metal atoms included in a metal layer form from diffusing. The metal layer may be formed after the first barrier layer 152 is formed.

The first barrier layer 152 may be a metal-containing layer. The first barrier layer 152 may include or may be formed of, e.g, a tantalum-containing layer, a titanium-containing layer, or a tungsten-containing layer. In example embodiments, the first barrier layer 152 may include or may be formed of, e.g., silicon-doped titanium nitride (TiSiN), Ti, TiN, TiAl, TiAlN, TiSi, TaC, TaCN, TaSiN, Ta, TaN, or WN.

Figure 14:
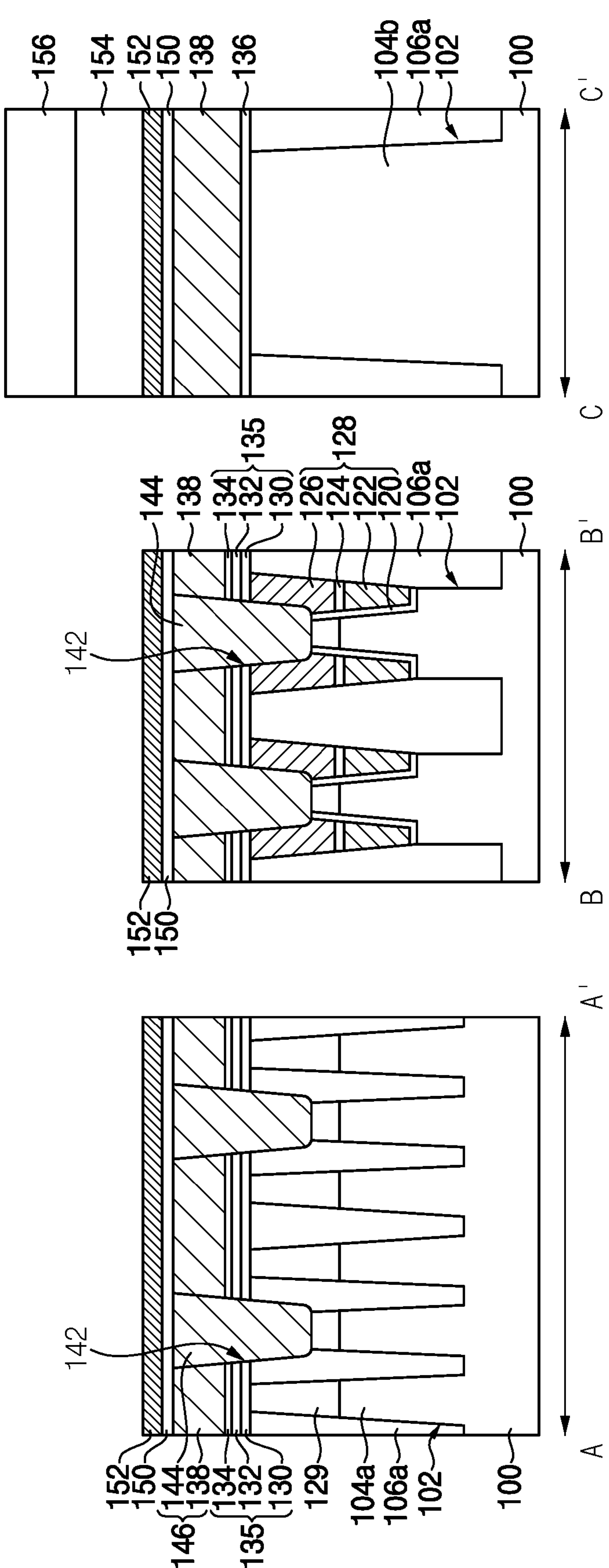

Referring to FIG. 14, a hard mask layer may be formed on the carbon injection layer 150. A photoresist pattern 156 may be formed on the hard mask layer by a photo process. The photoresist pattern 156 may be selectively expose the hard mask layer on the cell region I, and may cover the hard mask layer on the core/peripheral region II. The hard mask layer on the cell region I may be etched using the photoresist pattern 156 as an etch mask to form a hard mask pattern 154. The hard mask pattern 154 may cover the carbon injection layer 150 on the core/peripheral region II.

The hard mask pattern 154 may include or may be formed of, e.g., silicon oxide or silicon nitride.

After that, the photoresist pattern 156 may be removed.

Figure 15:
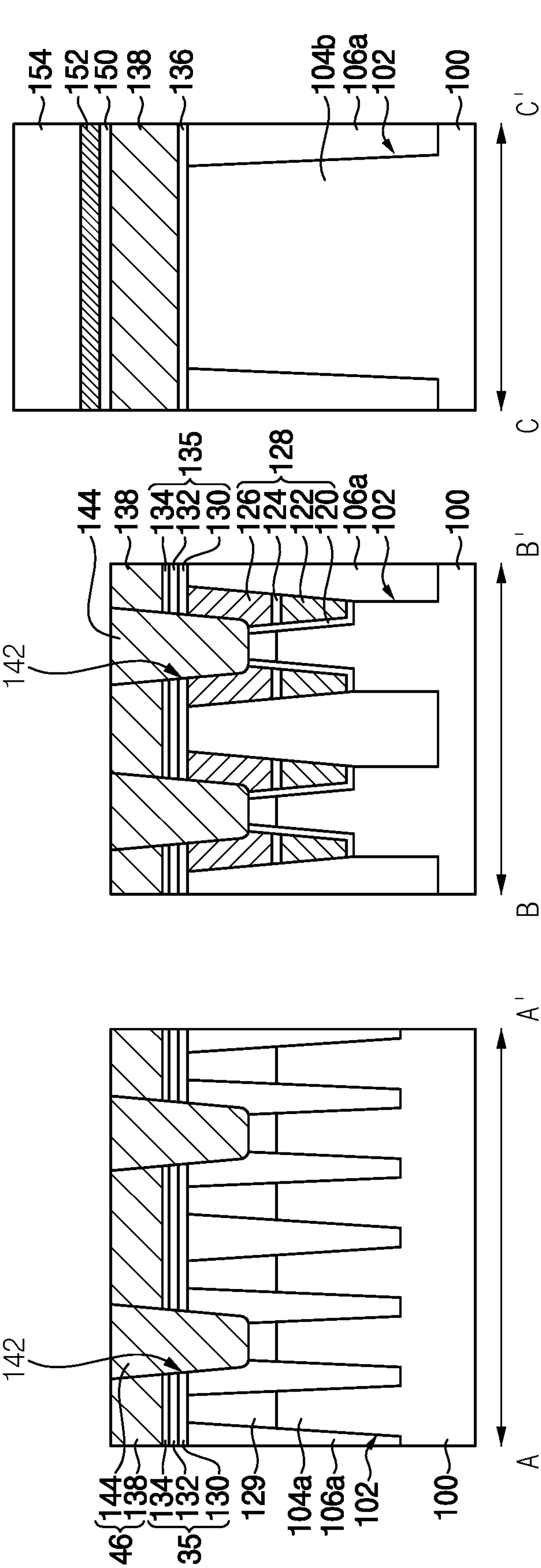

Referring to FIG. 15, the first barrier layer 152 and the carbon injection layer 150 on the cell region I may be etched using the hard mask pattern 154 as an etch mask. Accordingly, an upper surface of the preliminary polysilicon structure 146 may be exposed in the cell region I.

In example embodiments, in the etching process, the upper surface of the preliminary polysilicon structure 146 under the carbon injection layer 150 may be further etched by a partial thickness. In this case, although not shown, the upper surface of the preliminary polysilicon structure 146 may be lower than the upper surface of the first polysilicon layer 138 on the core/peripheral region II.

Also, since the core/peripheral region II is covered by the hard mask pattern 154, the first barrier layer 152 and the carbon injection layer 150 on the core/peripheral region II may remain without removing.

Figure 16:
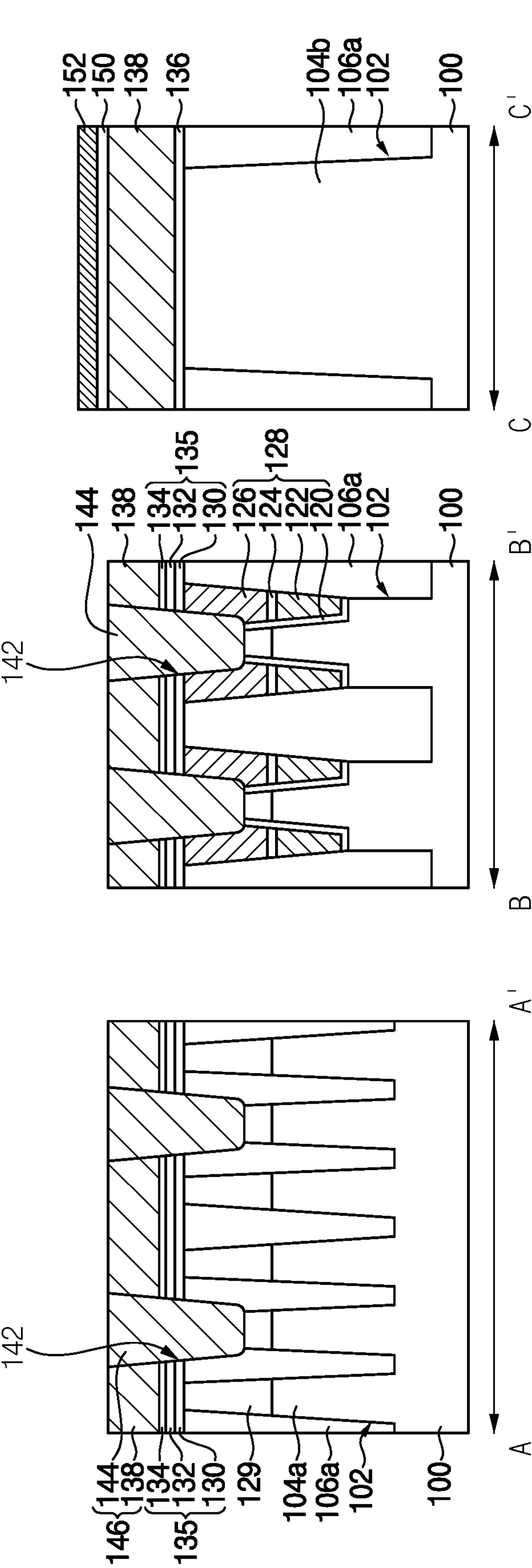

Referring to FIG. 16, the hard mask pattern 154 may be removed. Accordingly, an upper surface of the first barrier layer 152 may be exposed in the core/peripheral region II.

Since the first barrier layer 152 and the carbon injection layer 150 on the cell region I are removed, the upper surface of the preliminary polysilicon structure 146 exposed in the cell region I may be lower than the upper surface of the first barrier layer 152 exposed in the peripheral region II.

Figure 17:
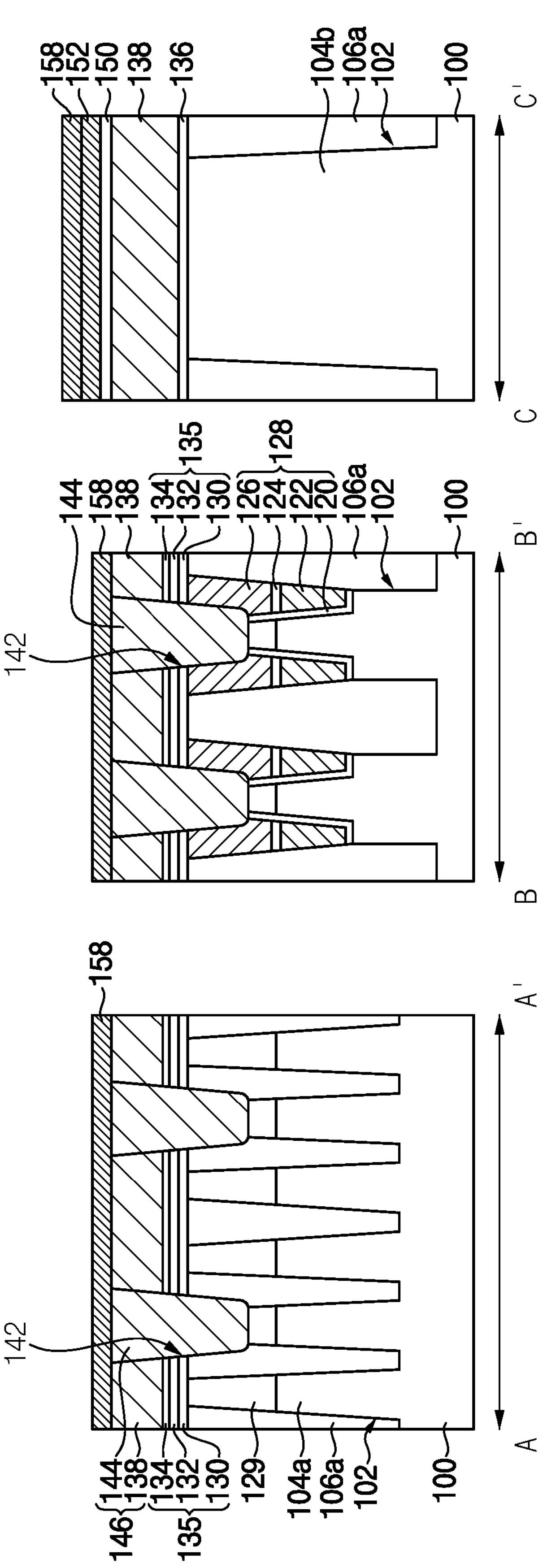

Referring to FIG. 17, a second barrier layer 158 may be formed on the preliminary polysilicon structure 146 and the first barrier layer 152. The second barrier layer 158 may prevent metal atoms included in a metal layer from diffusing. The metal layer may be formed after the first barrier layer 152 is formed.

The second barrier layer 158 may include or may be formed of silicon-doped titanium nitride (TiSiN), Ti, TiN, TiAl, TiAlN, TiSi, TaC, TaCN, TaSiN, Ta, TaN, or WN. The second barrier layer 158 may include or may be formed of a material that is the same as a material of the first barrier layer 152.

The preliminary polysilicon structure 146 and the second barrier layer 158 may be stacked on the cell region I. The first polysilicon layer 138, the carbon injection layer 150, the first barrier layer 152 and the second barrier layer 158 may be stacked on the core/peripheral region II. Only one barrier layer (i.e., the second barrier layer 158) may be formed on the cell region I, and two barrier layers (i.e., the first and second barrier layers 152 and 158) may be formed on the core/peripheral region II. Therefore, the second barrier layer 158 on the cell region I may have a thickness less than a total thickness of the first and second barrier layers 152 and 158 on the core/peripheral region II.

Figure 18:
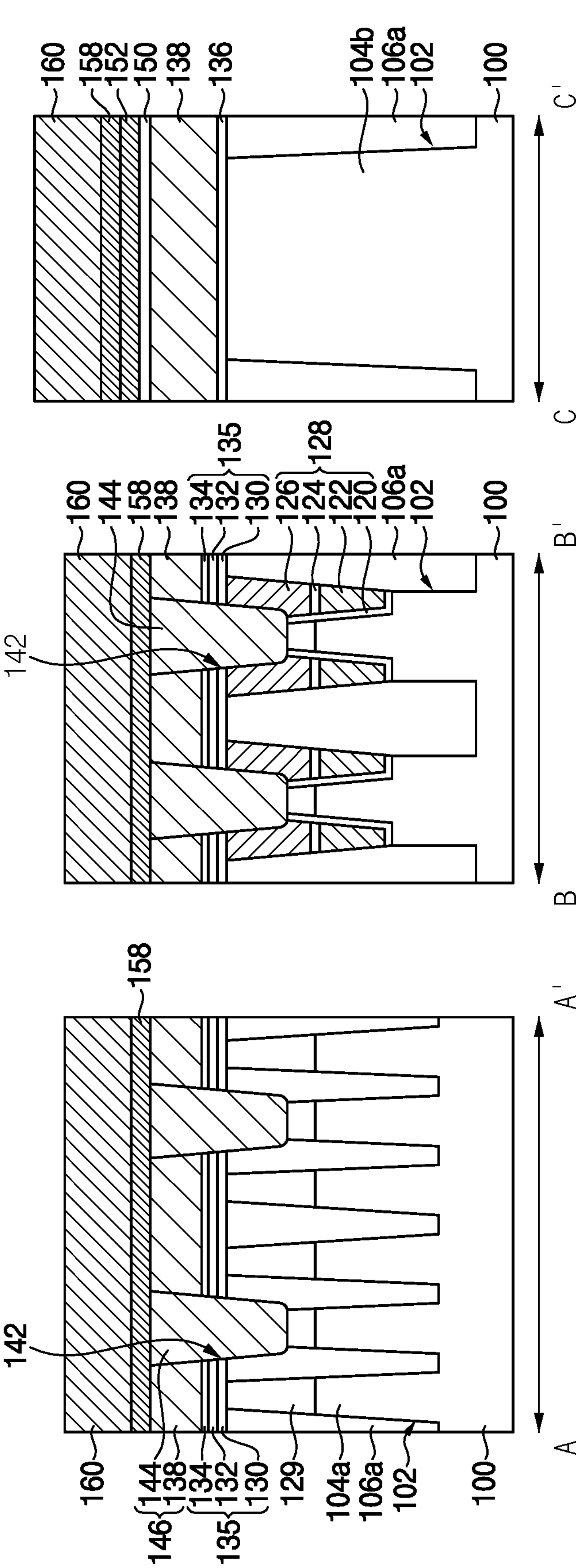
Figure 19:
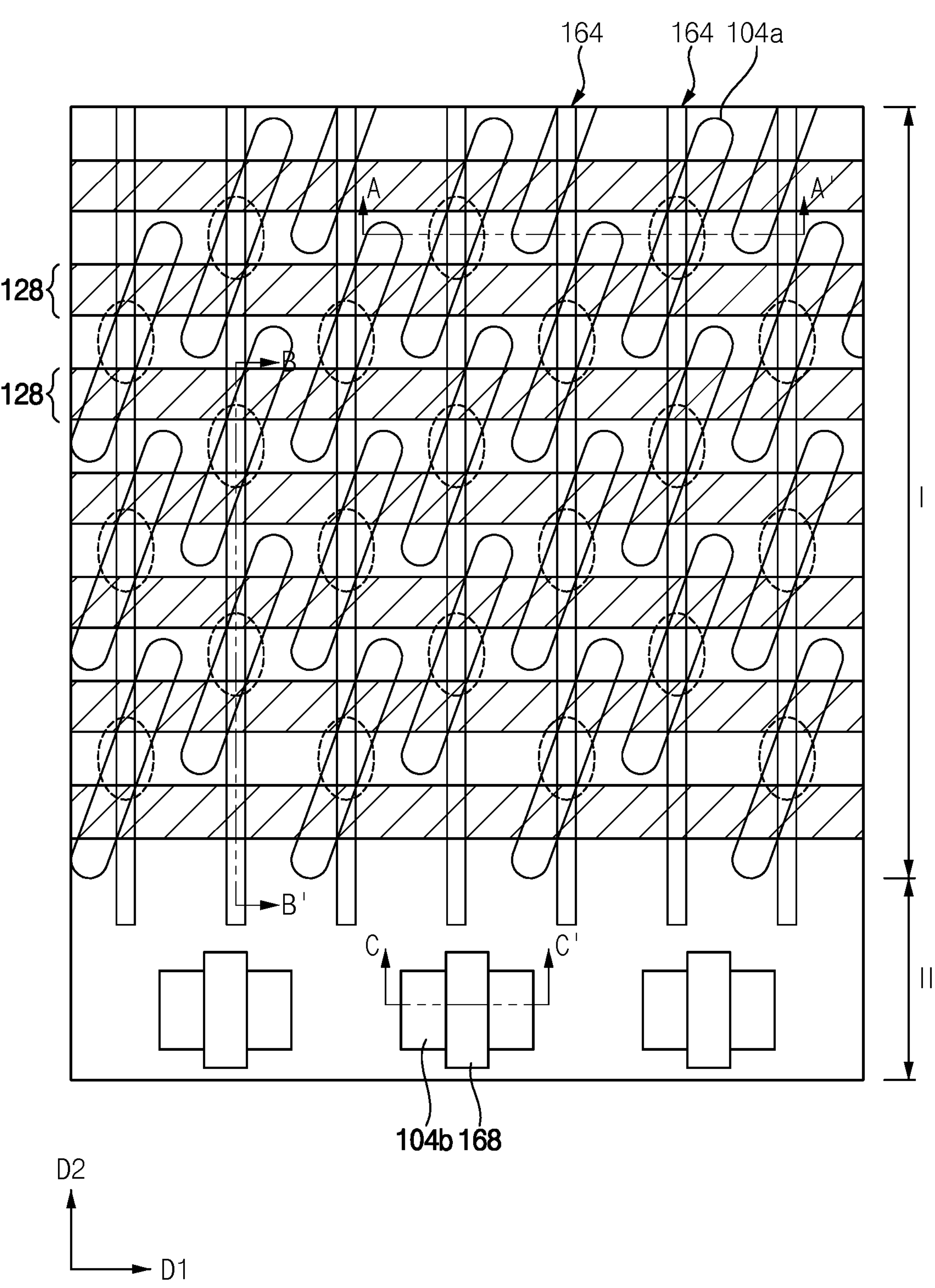

Referring to FIG. 18, a first metal layer 160 may be formed on the second barrier layer 158. The first metal layer 160 may include or may be formed of, e.g., tungsten.

Figure 20:
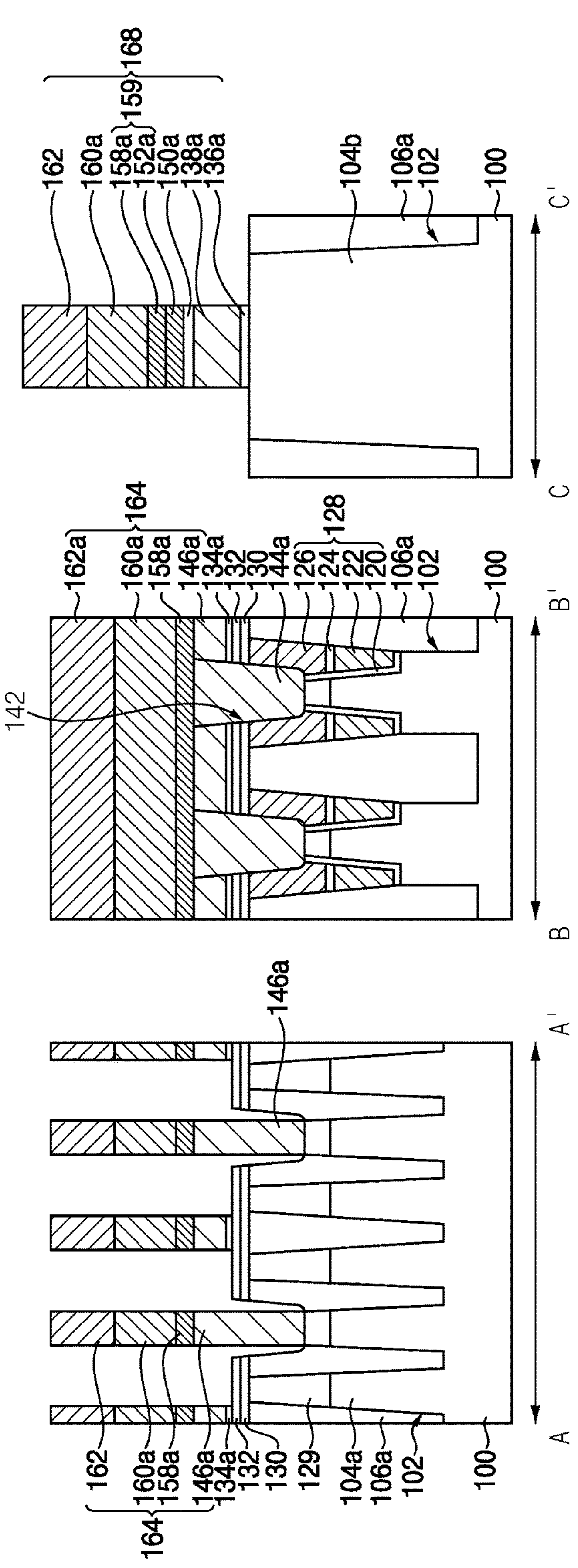

Referring to FIGS. 19 and 20, a second capping layer may be formed on the first metal layer 160, and the second capping layer may be patterned by a photolithography process to form a second capping layer pattern 162 on the first metal layer 160. In example embodiments, the second capping layer pattern 162 may include or may be formed of silicon nitride.

The second capping layer pattern 162 on the cell region I may be used as an etching mask for forming a bit line structure. Accordingly, the second capping layer pattern 162 on the cell region I may have a line shape extending in the second direction D2. The second capping layer pattern 162 on the core/peripheral region II may be used as an etching mask for forming a gate pattern.

A portion of the second capping layer pattern 162 on the cell region I may face the second polysilicon layer formed in the first opening 142.

The first metal layer 160, the second barrier layer 158, the first barrier layer 152, the carbon injection layer 150, the preliminary polysilicon structure 146, the first polysilicon layer 138, the third buffer insulation layer 134 and the gate insulation layer 136 may be sequentially etched using the second capping pattern as an etching mask to form a bit line structure 164 on the cell region I and a gate structure 168 on the core/peripheral region II.

The bit line structure 164 may include the polysilicon structure 146*a*, the second barrier layer pattern 158*a*, the first metal pattern 160*a*, and the second capping layer pattern 162 that may be sequentially stacked on each other. The gate structure 168 may include a gate insulation layer pattern 136*a*, the first polysilicon pattern 138*a*, the carbon injection layer pattern 150*a*, the first barrier layer pattern 152*a*, the second barrier layer pattern 158*a*, the first metal pattern 160*a*, and the second capping layer pattern 162 that may be sequentially stacked on each other.

A first portion of a bottom surface of the bit line structure 164 may contact the upper surface of the first active pattern 104*a*. A second portion of the bottom surface of the bit line structure 164 may contact an upper surface of a third buffer insulation layer pattern 134*a* formed by etching the third buffer insulation layer 134.

As shown, the bit line structure 164 may not include the carbon injection layer pattern. Accordingly, a resistance of the bit line structure 164 may not be increased by the carbon injection layer pattern on the polysilicon structure 146*a*. The carbon injection layer pattern 150*a* may be formed in the gate structure 168 on the core/peripheral region II. Accordingly, an upward diffusion of impurities doped into the first polysilicon pattern 138*a* may be prevented by the carbon injection layer pattern 150*a*.

In addition, the second barrier layer pattern 158*a* included in the bit line structure 164 may have a thickness less than a thickness of a barrier structure 159 including the first and second barrier layer patterns 152*a* and 158*a* in the gate structure 168.

Figure 22:
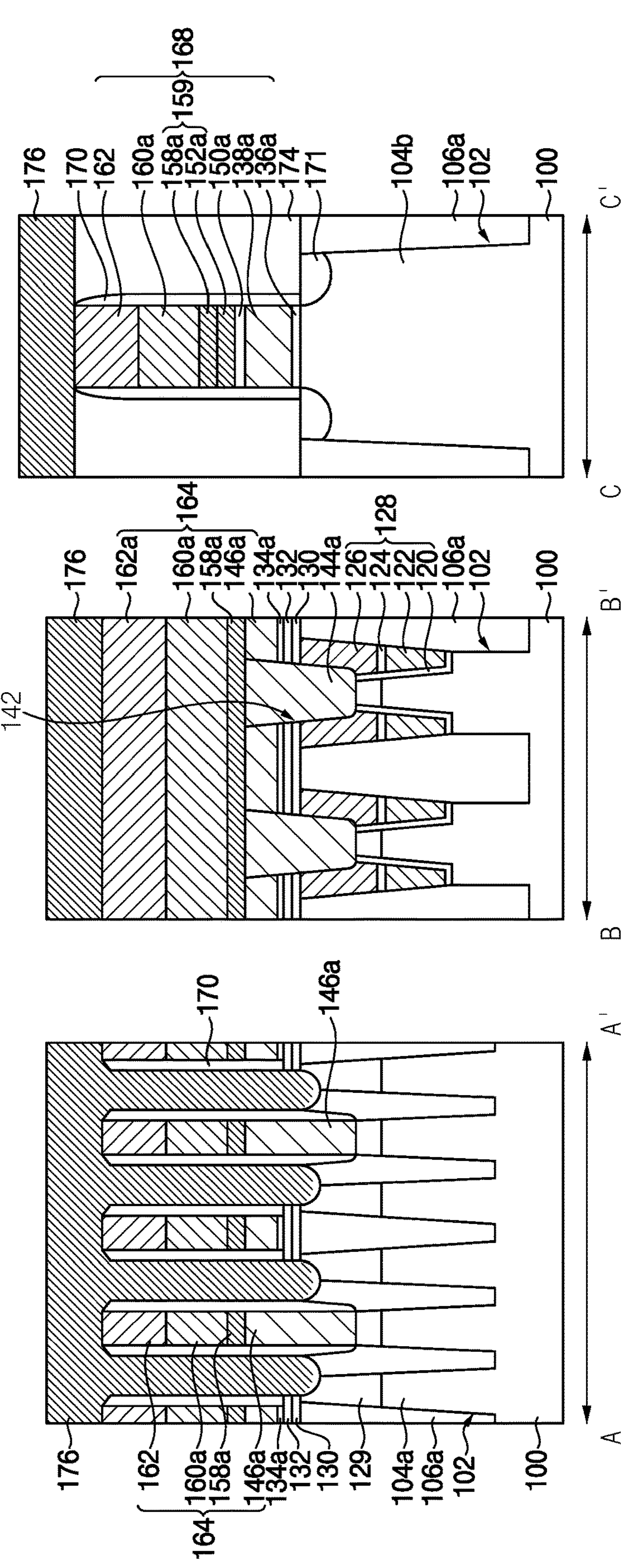

Referring to FIG. 22, a spacer 170 may be formed on sidewalls of the bit line structure 164 in the cell region I and on the sidewalls of the gate structure 168 in the core/peripheral region II. The spacer 170 may include or may be formed of an insulation material. The spacer 170 may also be formed on sidewalls of the third buffer insulation layer pattern 134*a*.

In example embodiments, the spacer 170 may be formed of a spacer structure in which a plurality of spacers are stacked. In some example embodiments, one of the spacers included in the spacer structure may be an air spacer. The phrase "air spacer" will be understood to include gaps (e.g., pockets) of air or gases other than air, such as other atmospheric gases or chamber gases that may be present during manufacturing.

Impurities may be implanted into an upper portion of the second active pattern 104*b* on the core/peripheral region II to form a second impurity region 171. The second impurity region 171 may serve as a source/drain of a peripheral transistor.

A first insulating interlayer 174 may be formed to fill a gap between the spacers 170. Thereafter, the first insulating interlayer 174 may be planarized to expose upper surfaces of the bit line structure 164 and the gate structure 168. The first insulating interlayer 174 may include or may be formed of silicon oxide.

A fourth mask pattern (not shown) may be formed on the first insulating interlayer 174 and the spacer 170. The first insulating interlayer 174 may be etched using the fourth mask pattern as an etching mask to form an opening in first insulating interlayer 174 on the cell region I.

In example embodiments, in the cell region I, the fourth mask pattern may extend in the first direction. A plurality fourth mask patterns may be spaced apart from each other in the second direction. In this case, the opening may be formed to overlap the buried gate structure 128. Then, an insulating pattern (not shown) may be formed to fill the opening. The insulating pattern may include or may be formed of, e.g., a nitride such as silicon nitride.

The first insulating interlayer 174 on the cell region I may be etched, and the second buffer insulating layer 132, the first buffer insulating layer 130, and the surface portion of the substrate 100 thereunder may be sequentially etched to form a second opening 172 exposing the surface of the substrate 100. In the etching process, an upper portion of the first active pattern 104*a* and an upper portion of the isolation layer 106*a* adjacent to the first active pattern 104*a* may be etched together.

Referring to FIG. 22, a third polysilicon layer 176 may be formed to cover the bit line structure 164 and the first insulating interlayer 174, and the third polysilicon layer 176 may fill the second opening 172. The third polysilicon layer 176 may include or may be formed of polysilicon doped with N-type or P-type impurities.

A void may be formed in the third polysilicon layer 176 filling the second opening 172. Heat treatment may be performed to remove the void in the third polysilicon layer 176. The heat treatment may include a laser annealing process.

Figure 23:
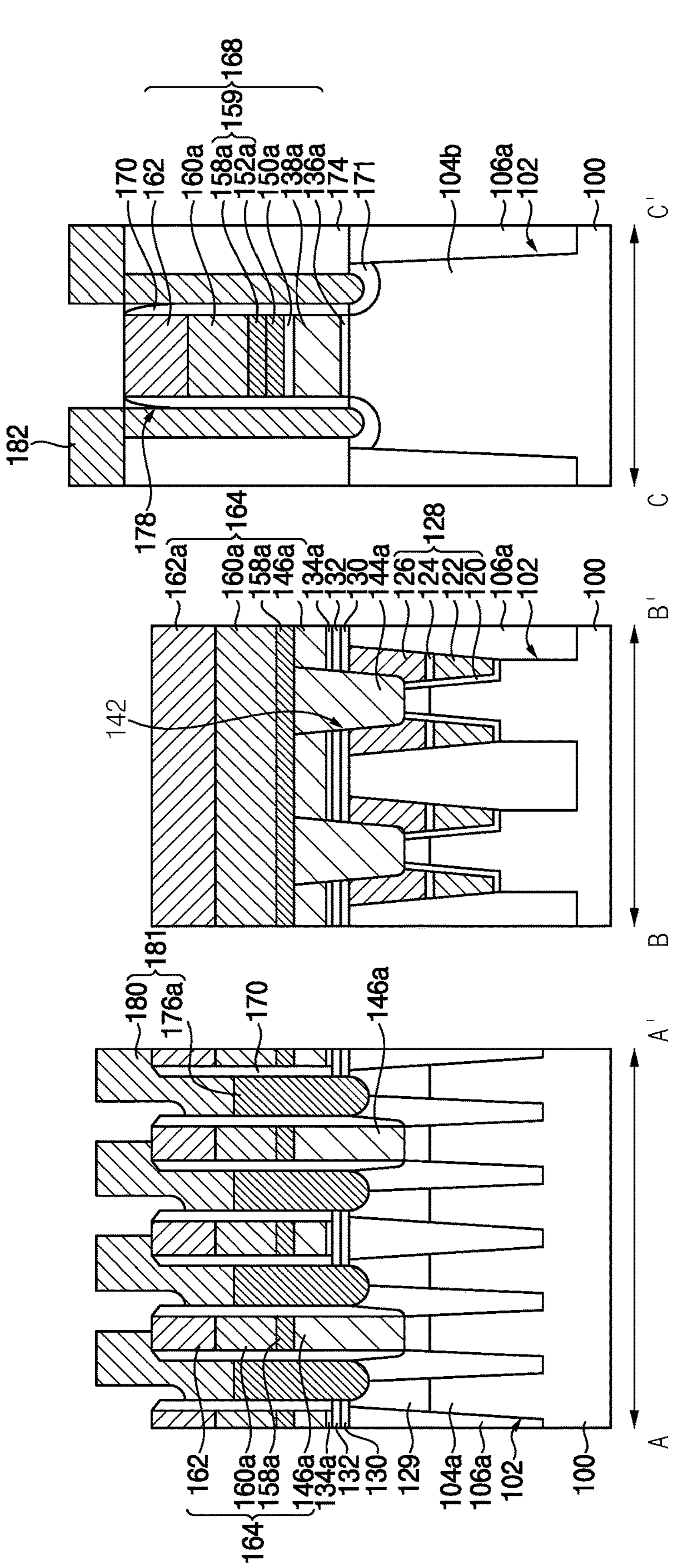

Referring to FIG. 23, an upper portion of the third polysilicon layer 176 may be removed to form a lower contact plug 176*a* filling a lower portion of the second opening 172. In this case, the third polysilicon layer 176 on the core/peripheral region II may be entirely removed. The removing process of the third polysilicon layer 176 may include an etch-back process.

Thereafter, contact holes 178 exposing the active regions on opposite sides of the gate structure 168 may be formed in the first insulating interlayer 174 on the core/peripheral region II.

A third barrier metal layer may be formed on the surface of the bit line structure 164, the lower contact plug 176*a*, the contact holes 178 and the first insulating interlayer 174, and a second metal layer may be formed on the third barrier metal layer. The second metal layer may be formed to have an upper surface higher than the upper surface of the bit line structure 164.

Portions of the second metal layer and the third barrier metal layer may be etched to form an upper contact plug 180 on the lower contact plug 176*a* in the cell region I. In the etching process of the second metal layer and the third barrier metal layer, a third opening may be formed between two adjacent upper contact plugs 180. In addition, a wiring pattern 182 may be formed to fill the contact hole 178 in the first insulating interlayer 174 on the core/peripheral region II. The wiring pattern 182 may include a contact plug filling the contact hole 178 and a conductive pattern on the first insulating interlayer 174.

Figure 24:
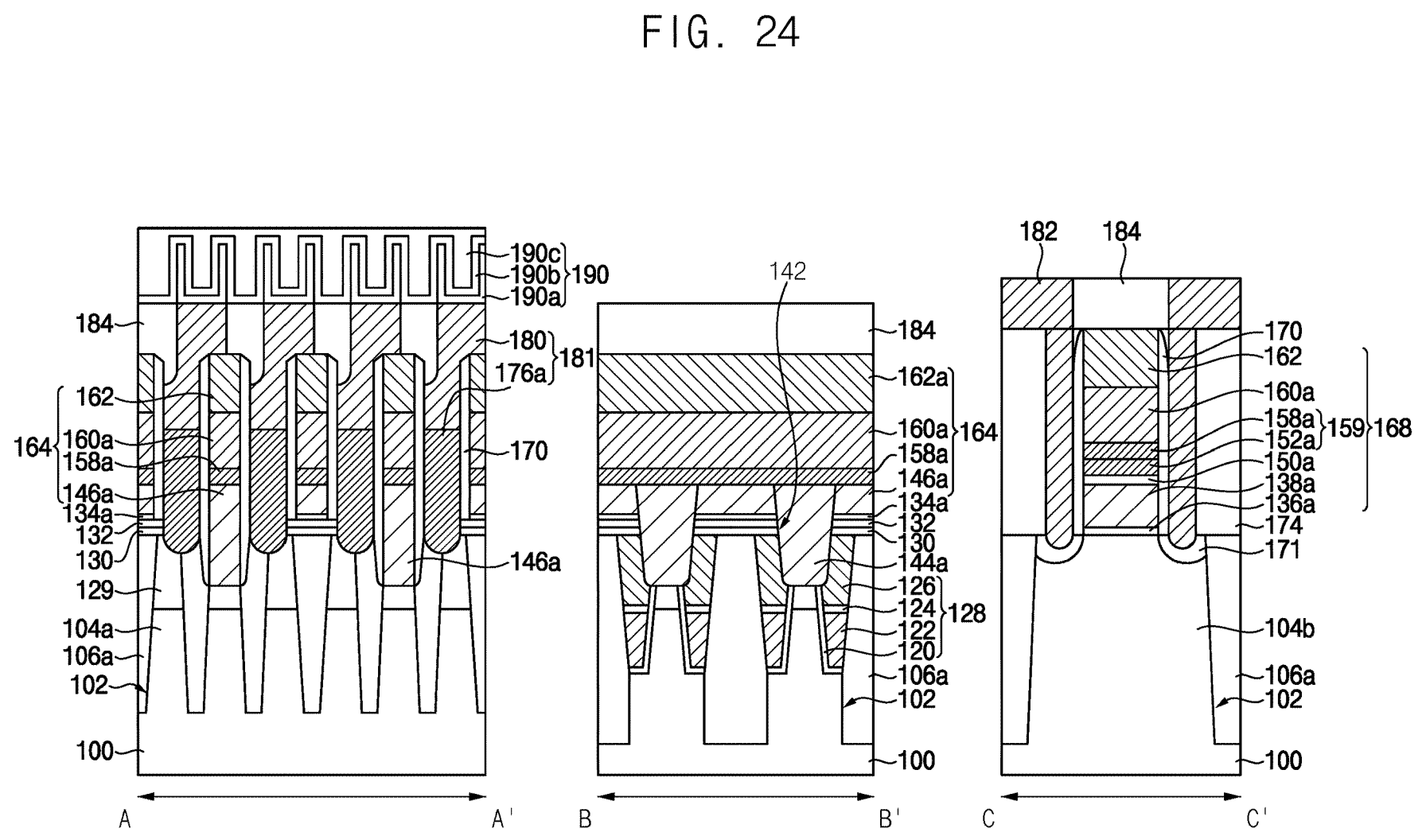

Referring to FIG. 24, an upper insulating pattern 184 may be formed to fill the third opening and a space between the wiring patterns 182.

A capacitor 190 may be formed on an upper surface of the upper contact plug 180 in the cell region I. The capacitor 190 may contact the upper contact plug 180.

The capacitor 190 may have a structure in which a lower electrode 190*a*, a dielectric layer 190*b*, and an upper electrode 190*c* are stacked.

By performing the above processes, the DRAM device may be manufactured.

As described above, reliability defects of the semiconductor device that may occur due to an increase of the resistance of the bit line structure and a change of characteristics of the transistor in the core/peripheral region may be decreased. Therefore, the semiconductor device may have high reliability.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:

a substrate including a cell region and a core/peripheral region;

a bit line structure disposed on the substrate of the cell region and including a polysilicon structure, a barrier pattern, a metal pattern, and a capping pattern that are stacked on each other; and a gate structure disposed on the substrate of the core/peripheral region and including a gate insulation pattern, a polysilicon pattern, a carbon-containing pattern, a barrier structure, a metal pattern, and a capping pattern that are stacked on each other, wherein the gate insulation pattern is disposed at a bottom of the gate structure, the capping pattern of the gate structure is disposed at a top of the gate structure, and wherein the polysilicon pattern is disposed on the gate insulation pattern, the carbon-containing pattern is disposed on the polysilicon pattern, the barrier structure is disposed on the carbon-containing pattern, and the metal pattern of the gate structure is disposed between the barrier structure and the capping pattern of the gate structure.

2. The semiconductor device of claim 1, wherein the carbon-containing pattern includes a polysilicon layer doped with at least carbon.

3. The semiconductor device of claim 1, wherein the carbon-containing pattern includes a polysilicon layer including carbon and nitrogen.

4. The semiconductor device of claim 1, wherein a thickness of the barrier pattern of the bit line structure is less than a thickness of the barrier structure of the gate structure.

5. The semiconductor device of claim 1, wherein the barrier pattern of the bit line structure and the barrier structure of the gate structure include the same material.

6. The semiconductor device of claim 1, wherein the barrier pattern of the bit line structure and the barrier structure of the gate structure include at least one selected from silicon-doped titanium nitride (TiSiN), Ti, TiN, TaC, TaCN, TaSiN, TaN, WN, and a combination thereof.

7. The semiconductor device of claim 1, wherein the polysilicon pattern of the gate structure is doped with N-type or P-type impurities.

8. The semiconductor device of claim 1, wherein the barrier pattern of the bit line structure has a thickness selected from a range of about 10 Å to about 50 Å.

9. A semiconductor device comprising:
a substrate including a cell region and a core/peripheral region;
a buried gate structure disposed in a gate trench at the substrate of the cell region and extending in a first direction parallel to an upper surface of the substrate;
a bit line structure disposed on the buried gate structure and the substrate and extending in a second direction perpendicular to the first direction;
a contact plug contacting the substrate and being spaced apart from the bit line structure;
a capacitor contacting an upper surface of the contact plug; and
a gate structure on the substrate of the core/peripheral region,
wherein the bit line structure includes a polysilicon structure, a first barrier pattern, a first metal pattern, and a first capping pattern that are sequentially stacked on each other,
wherein the gate structure includes a gate insulation pattern, a polysilicon pattern, a carbon-containing pattern, a second barrier pattern, a third barrier pattern, a second metal pattern, and a second capping pattern that are sequentially stacked on each other,
wherein the gate insulation pattern is disposed at a bottom of the gate structure, the second capping pattern is disposed at a top of the gate structure,
wherein the polysilicon pattern is disposed on the gate insulation pattern, the carbon-containing pattern is disposed on the polysilicon pattern, the second barrier pattern is disposed on the carbon-containing pattern, the third barrier pattern is disposed on the second barrier pattern, and the second metal pattern is disposed between the third barrier pattern and the second capping pattern,
wherein the third barrier pattern of the gate structure and the first barrier pattern of the bit line structure include the same material,
wherein the second metal pattern of the gate structure and the first metal pattern of the bit line structure include the same material, and
wherein the second capping pattern of the gate structure and the first capping pattern of the bit line structure include the same material.

10. The semiconductor device of claim 9, wherein the carbon-containing pattern includes a polysilicon layer including carbon and nitrogen.

11. The semiconductor device of claim 9, wherein a thickness of the carbon-containing pattern is less than a thickness of the second barrier pattern of the gate structure.

12. The semiconductor device of claim 9, wherein the first to third barrier patterns include the same material.

13. The semiconductor device of claim 9, wherein the second and third barrier patterns of the gate structure form a barrier structure of the gate structure, and
wherein a thickness of the barrier structure of the gate structure is greater than a thickness of the first barrier pattern of the bit line structure.

14. The semiconductor device of claim 9, wherein the carbon-containing pattern of the gate structure includes no metal, and
wherein the second and third barrier patterns of the gate structure include a metal.

15. The semiconductor device of claim 9, wherein the polysilicon pattern of the gate structure is doped with N-type or P-type impurities.

16. The semiconductor device of claim 9, wherein each of an upper surface of the polysilicon structure of the bit line structure and an upper surface of the polysilicon pattern of the gate structure is flat.

17. A semiconductor device, comprising:
a substrate divided into a cell region and a core/peripheral region, wherein the substrate includes an isolation pattern and an active pattern;
a buried gate structure disposed in a gate trench at the substrate of the cell region and extending in a first direction parallel to an upper surface of the substrate;
buffer insulation patterns on the substrate of the cell region;
a bit line structure contacting upper surfaces of the buffer insulation patterns and an upper surface of the active pattern between the buffer insulation patterns, wherein the bit line structure extends in a second direction parallel to the upper surface of the substrate and perpendicular to the first direction;
a contact plug contacting the active pattern and being spaced apart from the bit line structure;
a capacitor contacting an upper surface of the contact plug; and
a gate structure disposed on the substrate of the core/peripheral region and having a line width greater than a line width of the bit line structure,
wherein the bit line structure includes a polysilicon structure, a barrier pattern, a first metal pattern and a first capping pattern that are sequentially stacked on each other,
wherein the gate structure includes a gate insulation pattern, a polysilicon pattern, a carbon-containing pattern, a barrier structure, a second metal pattern and a second capping pattern that are sequentially stacked on each other,
wherein the gate insulation pattern is disposed at a bottom of the gate structure, the second capping pattern is disposed at a top of the gate structure,
wherein the polysilicon pattern is disposed on the gate insulation pattern, the carbon-containing pattern is disposed on the polysilicon pattern, the barrier structure is disposed on the carbon-containing pattern, and the second metal pattern is disposed between the barrier structure and the second capping pattern, . . .

wherein the first metal pattern of the bit line structure and the second metal pattern of the gate structure include the same material, and wherein the first capping pattern of the bit line structure and the second capping pattern of the gate structure include the same material.

18. The semiconductor device of claim 17, wherein a thickness of the barrier structure in the gate structure is greater than a thickness of the barrier pattern in the bit line structure.

19. The semiconductor device of claim 17, wherein the carbon-containing pattern includes a polysilicon layer including carbon and nitrogen.

20. The semiconductor device of claim 17, wherein the polysilicon pattern is doped with N-type or P-type impurities.

* * * * *